(12) United States Patent
Harada

(10) Patent No.: US 10,424,369 B2
(45) Date of Patent: Sep. 24, 2019

(54) SEMICONDUCTOR MEMORY DEVICE

(71) Applicant: TOSHIBA MEMORY CORPORATION, Tokyo (JP)

(72) Inventor: Yoshikazu Harada, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/909,404

(22) Filed: Mar. 1, 2018

(65) Prior Publication Data

US 2019/0115070 A1 Apr. 18, 2019

(30) Foreign Application Priority Data

Oct. 17, 2017 (JP) .................................. 2017-201234

(51) Int. Cl.
| | |
|---|---|
| *G11C 11/56* | (2006.01) |
| *G11C 16/34* | (2006.01) |
| *G11C 16/04* | (2006.01) |
| *G11C 16/26* | (2006.01) |
| *G11C 16/10* | (2006.01) |

(52) U.S. Cl.
CPC ...... *G11C 11/5628* (2013.01); *G11C 11/5642* (2013.01); *G11C 11/5671* (2013.01); *G11C 16/0483* (2013.01); *G11C 16/3459* (2013.01); *G11C 16/10* (2013.01); *G11C 16/26* (2013.01); *G11C 2211/5621* (2013.01)

(58) Field of Classification Search
CPC ............ G11C 11/5628; G11C 11/5642; G11C 11/5671; G11C 16/0483; G11C 16/3459
See application file for complete search history.

(56) References Cited

U.S. PATENT DOCUMENTS

| | | | | |
|---|---|---|---|---|
| 8,339,857 | B2 * | 12/2012 | Edahiro .............. | G11C 11/5621 365/185.17 |
| 8,917,557 | B2 * | 12/2014 | Sakaguchi ............. | G11C 16/10 365/185.02 |
| 9,251,902 | B2 | 2/2016 | Harada et al. | |
| 9,564,240 | B2 | 2/2017 | Harada | |
| 2014/0340964 | A1 * | 11/2014 | Shiino ..................... | G11C 16/26 365/185.03 |
| 2017/0178739 | A1 | 6/2017 | Maejima et al. | |
| 2017/0236595 | A1 * | 8/2017 | Maejima ............ | G11C 16/0483 365/185.12 |
| 2017/0271023 | A1 | 9/2017 | Maejima | |

FOREIGN PATENT DOCUMENTS

| | | |
|---|---|---|
| JP | 6097392 B2 | 3/2017 |
| JP | 2017-111847 A | 6/2017 |
| JP | 2017-168164 A | 9/2017 |

* cited by examiner

*Primary Examiner* — Tri M Hoang
(74) *Attorney, Agent, or Firm* — Kim & Stewart LLP

(57) ABSTRACT

A semiconductor memory device includes memory cells connected to word lines and bit lines. In a verification operation, a controller applies first and second verification voltages to a word line in sequence, a first voltage to a first bit line of a first cell and a second voltage to second bit line during first level verification, and, if the first cell passes first voltage level verification, the first voltage is then applied to both the first and second bit lines while the second verification voltage is applied to the word line.

19 Claims, 16 Drawing Sheets

VERIFICATION OPERATION
(FIRST EMBODIMENT)

FIG. 8

(0) SET "A" WRITE BL TO BE CHARGED

|  | WRITE LEVEL | | | | | | | |
|---|---|---|---|---|---|---|---|---|
|  | ER | A | B | C | D | E | F | G |
| ADL | 1 | 0 | 0 | 0 | 0 | 1 | 1 | 1 |
| BDL | 1 | 1 | 0 | 0 | 1 | 1 | 0 | 0 |
| CDL | 1 | 1 | 1 | 0 | 0 | 0 | 0 | 1 |
| SDL | 0 | 1 | 0 | 0 | 0 | 0 | 0 | 0 |
| SEN | 0 | 0 | 0 | 0 | 0 | 0 | 0 | 0 |

FIG. 9

(1) SENSE VOLTAGE OF "A" WRITE BL

|  | WRITE LEVEL | | | | | | | |
|---|---|---|---|---|---|---|---|---|
|  | ER | A | B | C | D | E | F | G |
| ADL | 1 | 0 | 0 | 0 | 0 | 1 | 1 | 1 |
| BDL | 1 | 1 | 0 | 0 | 1 | 1 | 0 | 0 |
| CDL | 1 | 1 | 1 | 0 | 0 | 0 | 0 | 1 |
| SDL | 0 | 1 | 0 | 0 | 0 | 0 | 0 | 0 |
| SEN | 0 | 0/1 | 0 | 0 | 0 | 0 | 0 | 0 |

FIG. 10

(2) STORE SENSE RESULT IN SDL

|  | WRITE LEVEL | | | | | | | |
|---|---|---|---|---|---|---|---|---|
|  | ER | A | B | C | D | E | F | G |
| ADL | 1 | 0 | 0 | 0 | 0 | 1 | 1 | 1 |
| BDL | 1 | 1 | 0 | 0 | 1 | 1 | 0 | 0 |
| CDL | 1 | 1 | 1 | 0 | 0 | 0 | 0 | 1 |
| SDL | 0 | 0/1 | 0 | 0 | 0 | 0 | 0 | 0 |
| SEN | 0 | 0/1 | 0 | 0 | 0 | 0 | 0 | 0 |

FIG. 11

(3) SET "B" WRITE BL TO BE CHARGED (START TO CHARGE BL)

|  | WRITE LEVEL | | | | | | | |
| --- | --- | --- | --- | --- | --- | --- | --- | --- |
|  | ER | A | B | C | D | E | F | G |
| ADL | 1 | 0 | 0 | 0 | 0 | 1 | 1 | 1 |
| BDL | 1 | 1 | 0 | 0 | 1 | 1 | 0 | 0 |
| CDL | 1 | 1 | 1 | 0 | 0 | 0 | 0 | 1 |
| SDL | 0 | 0/1 | 1 | 0 | 0 | 0 | 0 | 0 |
| SEN | 0 | 0/1 | 0 | 0 | 0 | 0 | 0 | 0 |

FIG. 12

(4) REFLECT SENSE RESULT OF "A" VERIFICATION

|  | WRITE LEVEL | | | | | | | |
| --- | --- | --- | --- | --- | --- | --- | --- | --- |
|  | ER | A | B | C | D | E | F | G |
| ADL | 1 | 0/1 | 0 | 0 | 0 | 1 | 1 | 1 |
| BDL | 1 | 1 | 0 | 0 | 1 | 1 | 0 | 0 |
| CDL | 1 | 1 | 1 | 0 | 0 | 0 | 0 | 1 |
| SDL | 0 | 0/1 | 1 | 0 | 0 | 0 | 0 | 0 |
| SEN | 0 | 0/1 | 0 | 0 | 0 | 0 | 0 | 0 |

FIG. 14

(X) REFLECT SENSE RESULT OF "A" VERIFICATION

| | WRITE LEVEL | | | | | | | |
|---|---|---|---|---|---|---|---|---|
| | ER | A | B | C | D | E | F | G |
| ADL | 1 | 0/1 | 0 | 0 | 0 | 1 | 1 | 1 |
| BDL | 1 | 1 | 0 | 0 | 1 | 1 | 0 | 0 |
| CDL | 1 | 1 | 1 | 0 | 0 | 0 | 0 | 1 |
| SDL | 0 | 0/1 | 0 | 0 | 0 | 0 | 0 | 0 |
| SEN | 0 | 0/1 | 0 | 0 | 0 | 0 | 0 | 0 |

FIG. 15

(Y) SET "B" WRITE BL TO BE CHARGED (START TO CHARGE BL)

| | WRITE LEVEL | | | | | | | |
|---|---|---|---|---|---|---|---|---|
| | ER | A | B | C | D | E | F | G |
| ADL | 1 | 0/1 | 0 | 0 | 0 | 1 | 1 | 1 |
| BDL | 1 | 1 | 0 | 0 | 1 | 1 | 0 | 0 |
| CDL | 1 | 1 | 1 | 0 | 0 | 0 | 0 | 1 |
| SDL | 0 | 0 | 1 | 0 | 0 | 0 | 0 | 0 |
| SEN | 0 | 0/1 | 0 | 0 | 0 | 0 | 0 | 0 |

FIG. 16

| | | VERIFICATION LEVEL | | | | | | |
|---|---|---|---|---|---|---|---|---|
| | | A | B | C | D | E | F | G |
| CHARGED BL | FIRST EMBODIMENT | A | PASS "A" +B | PASS "B" +C | PASS "C" +D | PASS "D" +E | PASS "E" +F | PASS "F" +G |
| | COMPARATIVE EXAMPLE | A | B | C | D | E | F | G |

FIG. 19

(0) SET "A" WRITE BL TO BE CHARGED

|     | WRITE LEVEL | | | | | | | |
| --- | --- | --- | --- | --- | --- | --- | --- | --- |
|     | ER | A | B | C | D | E | F | G |
| ADL | 1 | 0 | 0 | 0 | 0 | 1 | 1 | 1 |
| BDL | 1 | 1 | 0 | 0 | 1 | 1 | 0 | 0 |
| CDL | 1 | 1 | 1 | 0 | 0 | 0 | 0 | 1 |
| DDL | 0 | 0 | 0 | 0 | 0 | 0 | 0 | 0 |
| SDL | 0 | 1 | 0 | 0 | 0 | 0 | 0 | 0 |
| SEN | 0 | 0 | 0 | 0 | 0 | 0 | 0 | 0 |

FIG. 20

(1) SENSE VOLTAGE OF "A" WRITE BL

|     | WRITE LEVEL | | | | | | | |
| --- | --- | --- | --- | --- | --- | --- | --- | --- |
|     | ER | A | B | C | D | E | F | G |
| ADL | 1 | 0 | 0 | 0 | 0 | 1 | 1 | 1 |
| BDL | 1 | 1 | 0 | 0 | 1 | 1 | 0 | 0 |
| CDL | 1 | 1 | 1 | 0 | 0 | 0 | 0 | 1 |
| DDL | 0 | 0 | 0 | 0 | 0 | 0 | 0 | 0 |
| SDL | 0 | 1 | 0 | 0 | 0 | 0 | 0 | 0 |
| SEN | 0 | 0/1 | 0 | 0 | 0 | 0 | 0 | 0 |

FIG. 21

(2) STORE SENSE RESULT IN DDL

|     | WRITE LEVEL | | | | | | | |
| --- | --- | --- | --- | --- | --- | --- | --- | --- |
|     | ER | A | B | C | D | E | F | G |
| ADL | 1 | 0 | 0 | 0 | 0 | 1 | 1 | 1 |
| BDL | 1 | 1 | 0 | 0 | 1 | 1 | 0 | 0 |
| CDL | 1 | 1 | 1 | 0 | 0 | 0 | 0 | 1 |
| DDL | 0 | 0/1 | 0 | 0 | 0 | 0 | 0 | 0 |
| SDL | 0 | 1 | 0 | 0 | 0 | 0 | 0 | 0 |
| SEN | 0 | 0/1 | 0 | 0 | 0 | 0 | 0 | 0 |

FIG. 22

(3) SET "B" WRITE BL TO BE CHARGED (START TO CHARGE BL)

|  | WRITE LEVEL | | | | | | | |
|---|---|---|---|---|---|---|---|---|
|  | ER | A | B | C | D | E | F | G |
| ADL | 1 | 0 | 0 | 0 | 0 | 1 | 1 | 1 |
| BDL | 1 | 1 | 0 | 0 | 1 | 1 | 0 | 0 |
| CDL | 1 | 1 | 1 | 0 | 0 | 0 | 0 | 1 |
| DDL | 0 | 0/1 | 0 | 0 | 0 | 0 | 0 | 0 |
| SDL | 0 | 0 | 1 | 0 | 0 | 0 | 0 | 0 |
| SEN | 0 | 0/1 | 0 | 0 | 0 | 0 | 0 | 0 |

FIG. 23

(4) REFLECT SENSE RESULT OF "A" VERIFICATION

|  | WRITE LEVEL | | | | | | | |
|---|---|---|---|---|---|---|---|---|
|  | ER | A | B | C | D | E | F | G |
| ADL | 1 | 0/1 | 0 | 0 | 0 | 1 | 1 | 1 |
| BDL | 1 | 1 | 0 | 0 | 1 | 1 | 0 | 0 |
| CDL | 1 | 1 | 1 | 0 | 0 | 0 | 0 | 1 |
| DDL | 0 | 0/1 | 0 | 0 | 0 | 0 | 0 | 0 |
| SDL | 0 | 0 | 1 | 0 | 0 | 0 | 0 | 0 |
| SEN | 0 | 0/1 | 0 | 0 | 0 | 0 | 0 | 0 |

FIG. 24

| | | VERIFICATION LEVEL | | | | | | |
|---|---|---|---|---|---|---|---|---|
| | | A | B | C | D | E | F | G |
| CHARGED BL | SECOND EMBODIMENT | A | B | C | D | E | F | G |
| | COMPARATIVE EXAMPLE | A | B | C | D | E | F | G |

VERIFICATION OPERATION
(MODIFICATION OF FIRST EMBODIMENT)

SEMICONDUCTOR MEMORY DEVICE

CROSS-REFERENCE TO RELATED APPLICATION

This application is based upon and claims the benefit of priority from Japanese Patent Application No. 2017-201234, filed Oct. 17, 2017, the entire contents of which are incorporated herein by reference.

FIELD

Embodiments described herein relate generally to a semiconductor memory device.

BACKGROUND

An NAND-type flash memory is known as a semiconductor memory device.

DESCRIPTION OF THE DRAWINGS

FIG. 8 to FIG. 12 are diagrams illustrating operation of a latch circuit in the verification operation of the semiconductor memory device according to a first embodiment.

FIG. 14 to FIG. 16 are diagrams illustrating operation of a latch circuit in the verification operation of the semiconductor memory device according to the comparative example.

FIG. 19 to FIG. 23 are diagrams illustrating operation of a latch circuit in the verification operation of the semiconductor memory device according to the embodiment.

FIG. 24 is a diagram illustrating an example of a relation between a write level and a bit line charged during the verification operation in the second embodiment and a comparative example.

DETAILED DESCRIPTION

Figure 1:
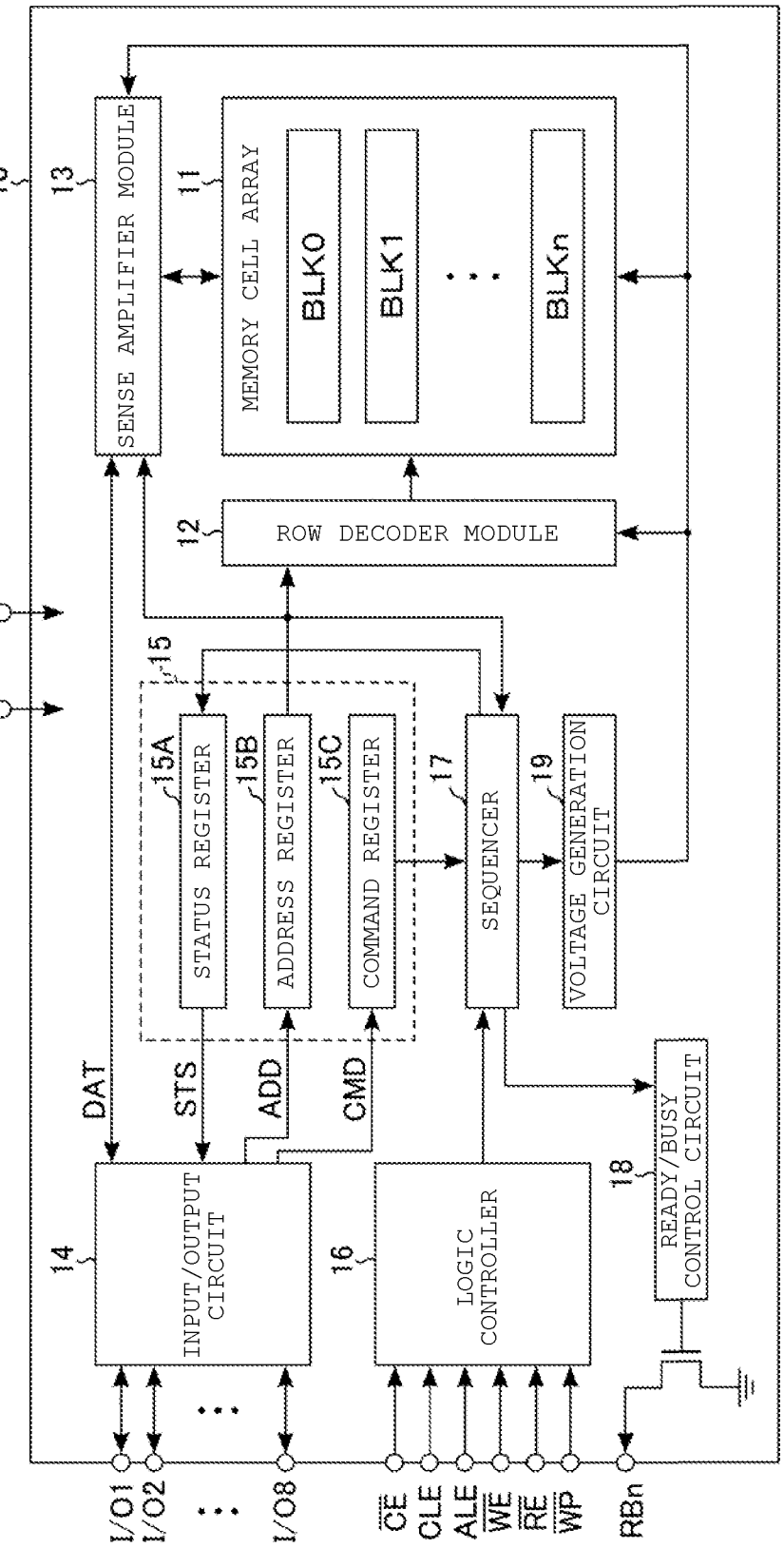
FIG. 1 is a block diagram illustrating a semiconductor memory according to a first embodiment.

Embodiments provide a semiconductor memory device capable of performing a write operation at a high speed.

In general, according to one embodiment, a semiconductor memory device, comprises: a plurality of memory cells that store first data values for multiple bits according to a first threshold voltage and second data values for the multiple bits according to a second threshold voltage higher than the first threshold voltage; a plurality of word lines and plurality of bit lines connected to the plurality of memory cells, each memory cell being respectively connected to one word line and one bit line; and a controller. The controller is configured to write data to the plurality of memory cells in a write operation including a program loop with a verification operation following a program operation. During the verification operation the controller is configured so as to apply a first verification voltage to a word line connected to a first memory cell, and then apply a second verification voltage higher than the first verification voltage to the word line. A first voltage is applied to a bit line connected to the first memory cell while the first verification voltage is being applied to the word line. A second voltage lower than the first voltage is applied to a bit line connected to a second memory cell that is connected to the word line while the first verification voltage is being applied to the word line. And, if the first memory cell passes verification at the first verification voltage, the first voltage is applied to the bit line connected to first memory cell and to the bit line connected to the second memory cell while the second verification voltage is being applied the word line.

Embodiments will be described below with reference to the drawings. The drawings are schematic. In the following description, constituent elements having substantially the same functions and configurations are denoted by the same reference numerals. When multiple instances of an element are depicted or described, additional letters or numbers may be appended to the base reference numeral such that particular instances of the element may be referred to as needed in the description. When there is no need to distinguish particular instances of an element only the base reference numeral will be used.

[1] First Embodiment

A semiconductor memory device according to a first embodiment will be described.

[1-1] Configuration

[1-1-1] Semiconductor Memory Device 10

FIG. 1 illustrates an example of the semiconductor memory device 10 according to a first embodiment. As illustrated in FIG. 1, the semiconductor memory device 10 includes a memory cell array 11, a row decoder module 12, a sense amplifier module 13, an input/output circuit 14, a resister 15, a logic controller 16, a sequencer 17, a ready/busy control circuit 18, and a voltage generation circuit 19.

The memory cell array 11 includes blocks BLK0 to BLKn (where n is a natural number equal to or greater than 1). The blocks BLK are a set of a plurality of nonvolatile memory cells associated with bit lines and word lines and are, for example, units of data erasure. Various data erasing operations are disclosed in U.S. patent application Ser. No. 13/235,389, filed on Sep. 18, 2011, "Nonvolatile Semiconductor Memory Device" and U.S. patent application Ser. No.

12/694,690, filed on Jan. 27, 2010, "Nonvolatile Semiconductor Memory Device", respectively. The entire contents of these patent applications are incorporated herein by reference.

The row decoder module 12 selects a block BLK to be subjected to various operations based on a block address stored in an address resister 15B. Then, the row decoder module 12 transmits a voltage supplied from the voltage generation circuit 19 to the selected block BLK.

The sense amplifier module 13 outputs data DAT read from the memory cell array 11 to an external controller via the input/output circuit 14, also referred to as I/O circuit 14. The sense amplifier module 13 transmits write data DAT received from the external controller via the input/output circuit 14 to the memory cell array 11.

The input/output circuit 14 transmits and receives input and output signals I/O (I/O1 to I/O8) with 8-bit width to and from the external controller. For example, the input/output circuit 14 transmits the write data DAT included in the input and output signal I/O received from the external controller to the sense amplifier module 13. The input/output circuit 14 transmits the read data DAT transferred from the sense amplifier module 13 as the input and output signal I/O to the external controller.

The resister 15 includes a status register 15A, the address register 15B, and a command register 15C. The status register 15A retains, for example, status information STS of the sequencer 17. The status register 15A transfers the status information STS to the input/output circuit 14 in response to an instruction of the sequencer 17. The address register 15B stores address information ADD transferred from the input/output circuit 14. A block address, a column address, and a page address included in the address information ADD are used in the row decoder module 12, the sense amplifier module 13, and the sequencer 17, respectively. The command register 15C stores command CMD transferred from the input/output circuit 14.

The logic controller 16 receives various control signals from the external memory controller and controls the input/output circuit 14 and the sequencer 17 based on the received control signals. As the control signals, for example, a chip enable signal/CE, a command latch enable signal CLE, an address latch enable signal ALE, a write enable signal/WE, a read enable signal/RE, and a write-protect signal/WP are used.

The chip enable signal/CE enables the semiconductor memory device 10. The command latch enable signal CLE is used to notify the input/output circuit 14 that a signal input to the semiconductor memory device 10 is the command CMD. The address latch enable signal ALE is used to notify the input/output circuit 14 that a signal input to the semiconductor memory device 10 is the address information ADD. The write enable signal/WE and the read enable signal/RE are, for example, used to instruct the input/output circuit 14 to input and output the input and output signals I/O. The write-protect signal/WP is, for example, used to place the semiconductor memory device 10 into a protected state at the time of turning on and off power, for example.

The sequencer 17 controls overall operation of the semiconductor memory device 10 based on the address information ADD stored in the address resister 15B and the command CMD stored in the command resister 15C. For example, the sequencer 17 controls the row decoder module 12, the sense amplifier module 13, and the voltage generation circuit 19 to execute various operations such as a write operation or a read operation.

The ready/busy control circuit 18 generates a ready/busy signal RBn based on a present operation state of the sequencer 17. The ready/busy signal RBn is used to notify the external memory controller whether the semiconductor memory device 10 is in a ready state in which the device 10 is ready to receive a command from the external memory controller or a busy state in which the device 10 is not ready to receive a command from the external memory controller.

For example, when the semiconductor memory device 10 is in the ready state, the ready/busy signal RBn is at an "H" level, and when the semiconductor memory device 10 is in the busy state, the ready/busy signal RBn is at an "L" level. In the description, an n-channel MOS transistor to which an "H" level voltage is input to a gate is turned on, and an n-channel MOS transistor to which an "L" level voltage is input to the gate is turned off.

The voltage generation circuit 19 generates a desired voltage based on the control of the sequencer 17, and supplies the generated voltage to the memory cell array 11, the row decoder module 12, and the sense amplifier module 13.

[1-1-2] Circuit of Memory Cell Array 11

Figure 2:
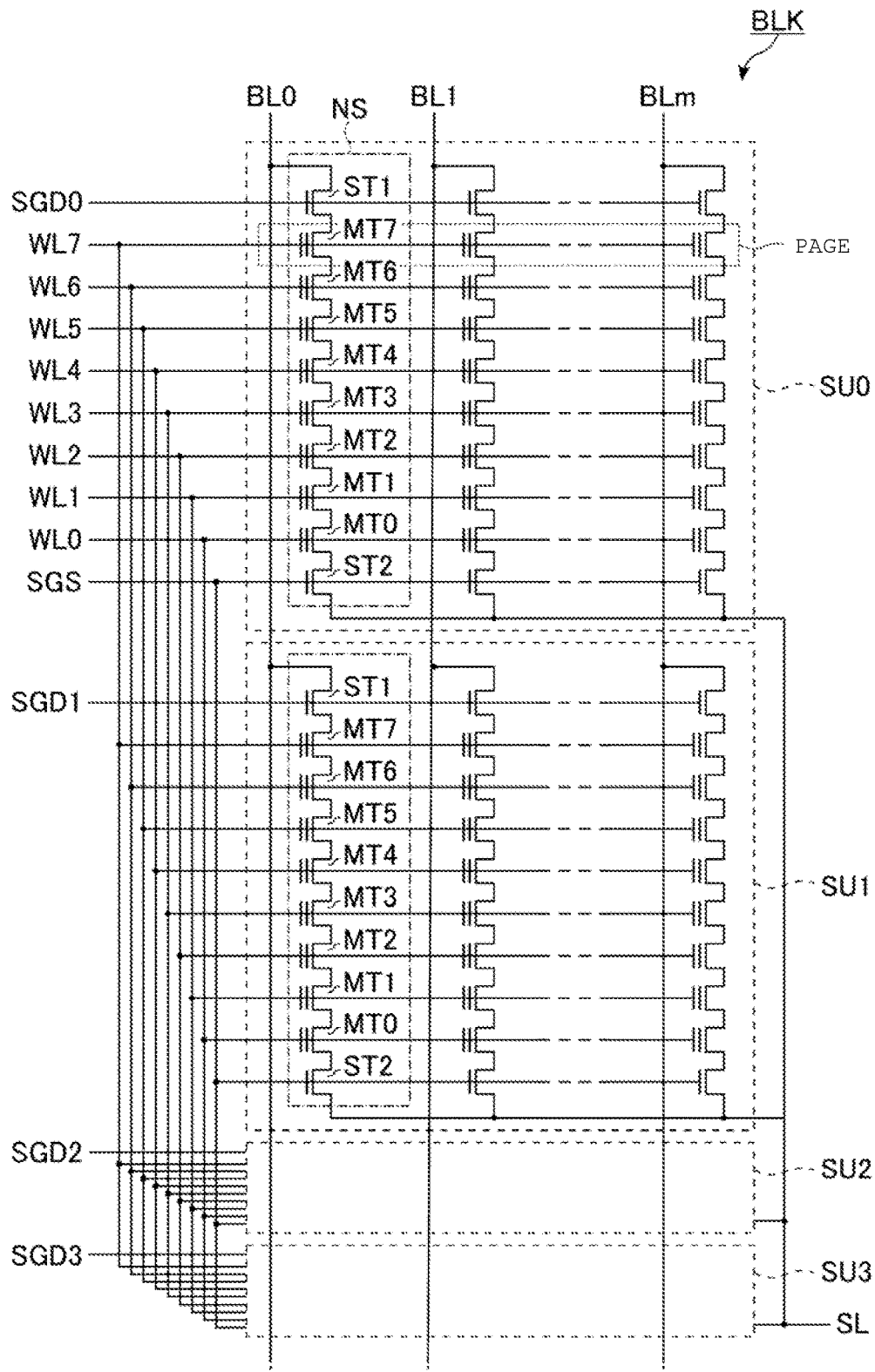
FIG. 2 is a circuit diagram illustrating a circuit of a memory cell array in a first embodiment.

FIG. 2 is an example of a circuit of the memory cell array 11 in the first embodiment, and illustrates a detailed circuit of one extracted block BLK. The block BLK includes, for example, four string units SU0 to SU3 as illustrated in FIG. 2.

Each string unit SU includes a plurality of NAND strings NS respectively associated with the bit lines BL0 to BLm (where m is an integer of 1 or more). Each NAND string NS includes, for example, memory cell transistors MT0 to MT7 and selection transistors ST1 and ST2.

The memory cell transistor MT includes control gates and charge storage layers and stores data in a nonvolatile manner. The memory cell transistors MT0 to MT7 in each NAND string NS are connected in series between a source of the select transistor ST1 and a drain of the select transistor ST2. Control gates of the memory cell transistors MT0 to MT7 in the same block BLK are connected commonly to word lines WL0 to WL7, respectively.

In the following description, a set of 1-bit data stored in the plurality of memory cell transistors MT connected to a common word line WL within a string unit SU is referred to as a "page". Therefore, when 2-bit data can be stored in each memory cell transistor MT, the set of memory cell transistors MT connected to a common word line WL within one string unit SU stores 2 pages worth of data.

The select transistors ST1 and ST2 are used to select the string unit SU in various operations. A drain of the select transistor ST1 in the NAND string NS corresponding to the same column address is commonly connected to the corresponding bit line BL. Gates of the select transistors ST1 in the string units SU0 to SU3 are commonly connected to selection gate lines SGD0 to SGD3, respectively. In the same block BLK, a source of the select transistor ST2 is commonly connected to a source line SL, and a gate of the select transistor ST2 is commonly connected to a selection gate line SGS.

In the circuit of the memory cell array 11 described above, the word lines WL0 to WL7 are provided for each block BLK. The bit lines BL0 to BLm are shared between the plurality of blocks BLK. The source line SL is shared between the plurality of blocks BLK. The number of string units SU in each block BLK and the number of memory cell transistors MT and select transistors ST1 and ST2 in each NAND string NS are merely examples and can be designed freely. The number of word lines WL and selection gate lines SGD and SGS change based on the number of memory cell transistors MT and select transistors ST1 and ST2.

[1-1-3] Threshold Distribution of Memory Cell Transistor MT

As a method of writing the memory cell transistor MT in the semiconductor memory device 10 according to the first embodiment, a Triple-Level Cell (TLC) method is used in which 3-bit data can be stored in each memory cell transistor MT.

Figure 3:
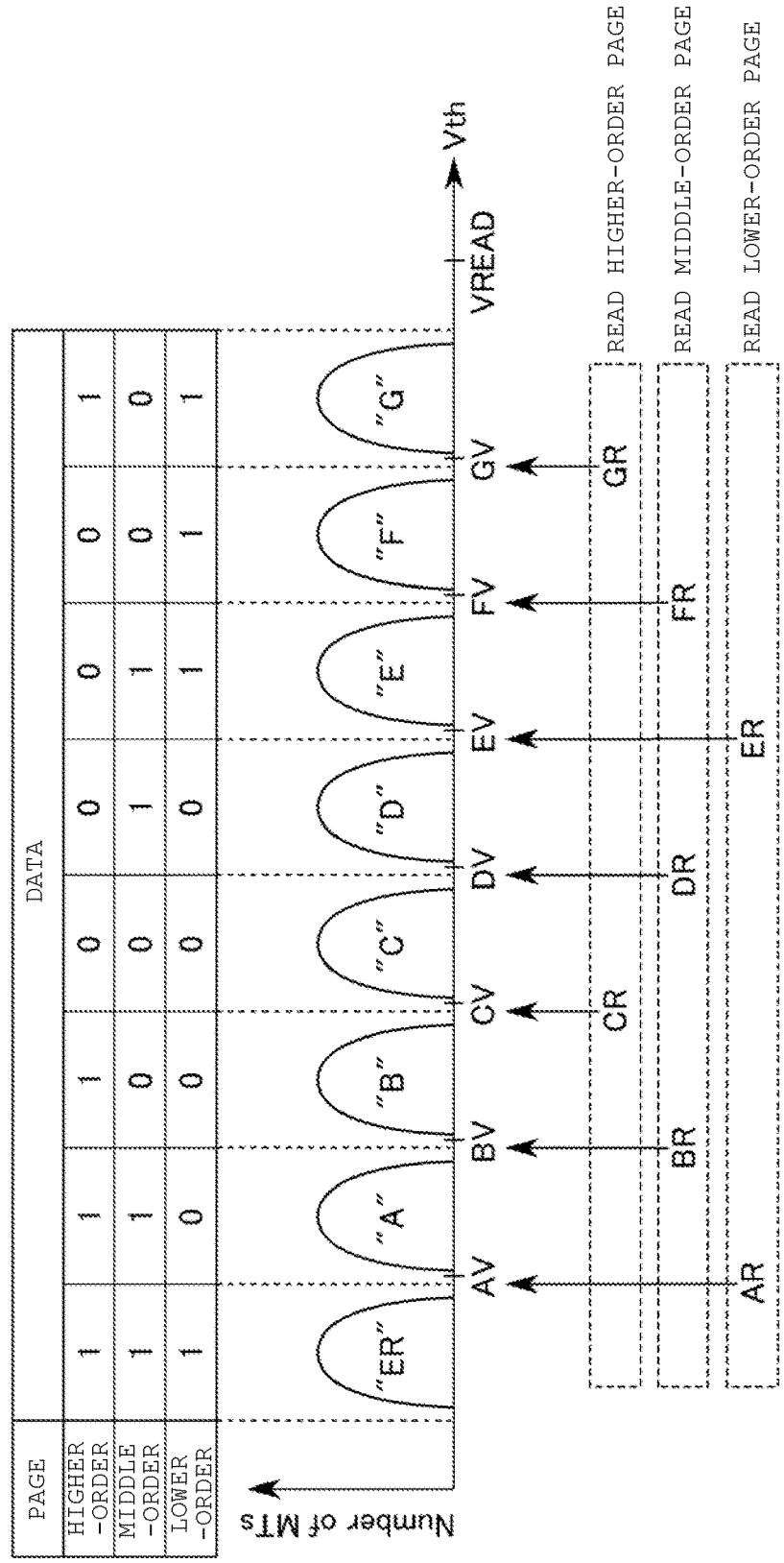
FIG. 3 is a threshold distribution diagram illustrating an example of a threshold distribution of a memory cell transistor in a first embodiment.

FIG. 3 illustrates examples of threshold distribution, data allocation, read voltage, and verification voltage of the memory cell transistor MT in the TLC method. In the threshold distribution illustrated in FIG. 3, a vertical axis corresponds to the number of memory cell transistors MT and a horizontal axis corresponds to a threshold voltage Vth of the memory cell transistor MT.

In the TLC method, the plurality of memory cell transistors MT form eight possible threshold distributions as illustrated in FIG. 3. The eight threshold distributions (write levels) are referred to as "ER" level, "A" level, "B" level, "C" level, "D" level, "E" level, "F" level, and "G" level in the ascending order of threshold voltage. For example, different 3-bit data values can be allocated to the "ER" level, the "A" level, the "B" level, the "C" level, the "D" level, the "E" level, the "F" level, and the "G" level, respectively, as follows.

"ER" level: "111" data
"A" level: "011" data
"B" level: "001" data
"C" level: "000" data
"D" level: "010" data
"E" level: "110" data
"F" level: "100" data
"G" level: "101" data, wherein the data notation above corresponds to "lower-order bit value/middle-order bit value/higher-order bit value."

Between adjacent threshold distributions, verification voltages to be used in the write operation are set, respectively. Specifically, verification voltages AV, BV, CV, DV, EV, FV, and GV are set corresponding to the "A" level, "B" level, "C" level, "D" level, "E" level, "F" level, and "G" level, respectively.

The verification voltage AV is set between a maximum threshold voltage at the "ER" level and a minimum threshold voltage at the "A" level. When the verification voltage AV is applied to the memory cell transistors MT, the memory cell transistors MT included in the "ER" level are turned on, and the memory cell transistors MT of the "A" level or higher are turned off.

Other verification voltages BV, CV, DV, EV, FV, and GV are also set similarly to the verification voltage AV. The verification voltage BV is set between the "A" level and the "B" level, the verification voltage CV is set between the "B" level and the "C" level, the verification voltage DV is set between the "C" level and the "D" level, the verification voltage EV is set between the "D" level and the "E" level, the read voltage FV is set between the "E" level and the "F" level, and the read voltage GV is set between the "F" level and the "G" level.

For example, the verification voltage AV may be set to 0.8 V, the verification voltage BV may be set to 1.6 V, the verification voltage CV may be set to 2.4 V, the verification voltage DV may be set to 3.1 V, the verification voltage EV may be set to 3.8 V, the verification voltage FV may be set to 4.6 V, and the verification voltage GV may be set to 5.6 V. However, the verification voltages AV, BV, CV, DV, EV, FV, and GV may be set stepwise in a range from 0 V to 7.0 V, for example, as appropriate.

In addition, read voltages to be used in the read operation are set between adjacent threshold distributions. Specifically, a read voltage AR is set between a maximum threshold voltage at the "ER" level and a minimum threshold voltage at the "A" level to determine whether the threshold voltage of a memory cell transistor MT is included in the "ER" level or in the "A" level or higher.

Other read voltages BR, CR, DR, ER, FR, and GR are also set similarly to the read voltage AR. The read voltage BR is set between the "A" level and the "B" level, the read voltage CR is set between the "B" level and the "C" level, the read voltage DR is set between the "C" level and the "D" level, the read voltage ER is set between the "D" level and the "E" level, the read voltage FR is set between the "E" level and the "F" level, and the read voltage GR is set between the "F" level and the "G" level.

A read pass voltage VREAD is set to a voltage higher than the maximum threshold voltage of the highest threshold distribution (for example, "G" level). The memory cell transistors MT to which the read pass voltage VREAD is applied to a gate are turned on regardless of data stored therein.

For example, the verification voltages AV, BV, CV, DV, EV, FV, and GV are set higher than the read voltages AR, BR, CR, DR, ER, FR, and GR, respectively. That is, the verification voltages AV, BV, CV, DV, EV, FV, and GV are set near low bound portions of the threshold distributions of the "A" level, the "B" level, the "C" level, the "D" level, the "E" level, the "F" level, and the "G" level, respectively.

When the data allocation described above is applied, one page data (lower-order page data) of the lower-order bit in the read operation is defined by readout results using the read voltages AR and ER. One page data (middle-order page data) of the middle-order bit is defined by readout results using the read voltages BR, DR, and FR. One page data (higher-order page data) of the higher-order bit is defined by readout results using the read voltages CR and GR. Since the lower-order page data, the middle-order page data, and the higher-order page data values can be determined by two read operations, three read operations, and two read operations, respectively, the data allocation is referred to as "2-3-2 code".

The number of bits of data stored in each memory cell transistor MT described above and the data allocation with respect to the threshold distribution of the memory cell transistors MT are merely examples. For example, data of 2 bits or 4 bits or more than 4 bits may be stored in each memory cell transistor MT. In addition, each of the read voltage and the read pass voltage may be set to the same voltage level in each method, or may be set to different voltage levels.

[1-1-4] Circuit of Row Decoder Module 12

Figure 4:
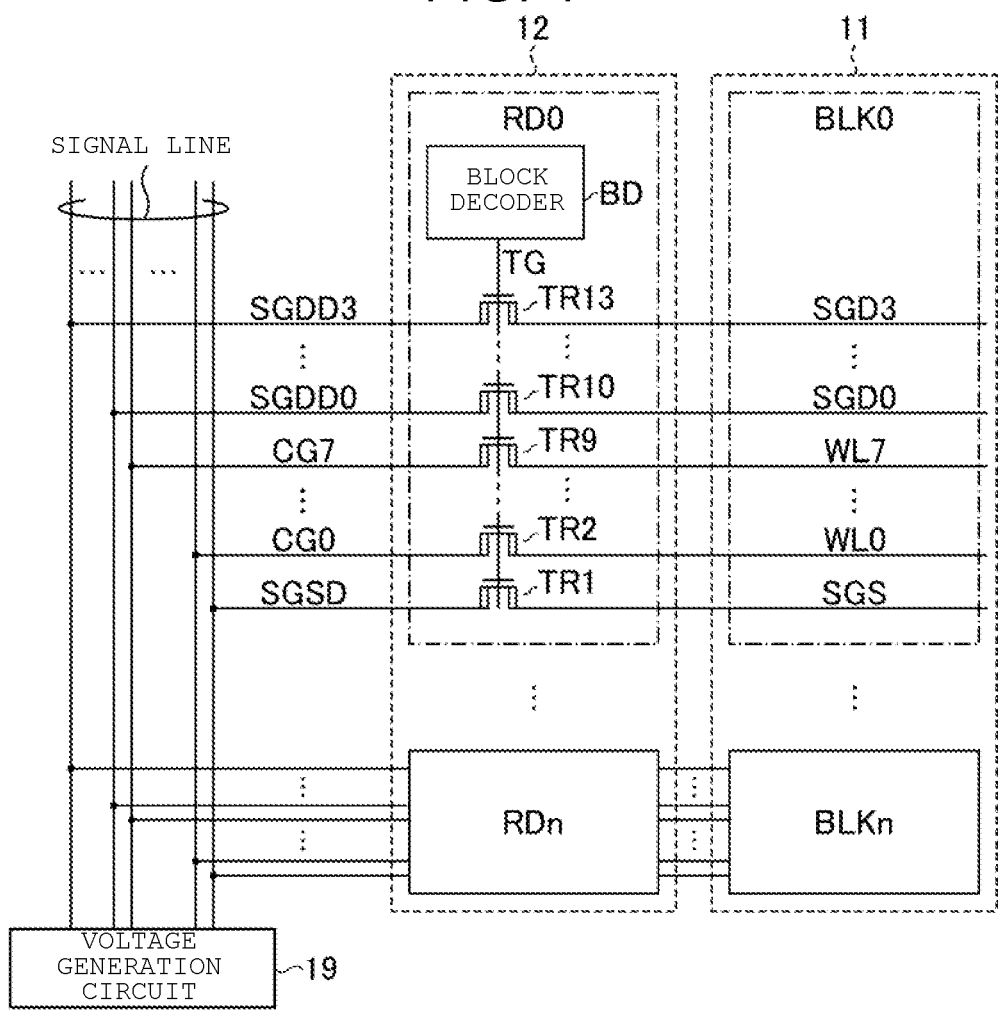
FIG. 4 is a circuit diagram of a row decoder in a first embodiment.

FIG. 4 is an example of a circuit of the row decoder module 12 in the first embodiment, and illustrates a detailed circuit of the row decoder module 12 extracted corresponding to one block BLK. The row decoder module 12 includes row decoders RD0 to RDn as illustrated in FIG. 4.

The row decoders RD0 to RDn are associated with the blocks BLK0 to BLKn, respectively. That is, one row decoder RD is associated with one block BLK. The detailed circuit of the row decoder RD will be described below by focusing the row decoder RD0 corresponding to the block BLK0.

The row decoder RD includes a block decoder BD and high breakdown voltage n-channel MOS transistors TR1 to TR13. The block decoder BD decodes a block address and applies a predetermined voltage to a transfer gate line TG based on the decoding result. The transfer gate line TG is commonly connected to gates of the transistors TR1 to TR13. The transistors TR1 to TR13 are connected between various signal lines wired from the voltage generation circuit 19 and interconnects of the associated block BLK.

Specifically, one end of the transistor TR1 is connected to a signal line SGSD, and the other end of the transistor TR1 is connected to a selection gate line SGS. Similarly, one end of each of the transistors TR2 to TR9 is connected to signal lines CG0 to CG7, respectively, and the other end of each of the transistors TR2 to TR9 is connected to the word lines WL0 to WL7, respectively. An end of each of the transistors TR10 to TR13 is connected to signal lines SGDD0 to SGDD3, respectively, and the other end of these transistors TR10 to TR13 is connected to selection gate lines SGD0 to SGD3, respectively.

With the above configuration, the row decoder module 12 selects the block BLK for executing various operations. Specifically, the block decoders BD corresponding to the selected and non-selected block BLK apply the "H" level voltage and the "L" level voltage to the transfer gate line TG in various operations, respectively.

For example, when the block BLK0 is selected, the transistors TR1 to TR13 in the row decoder RD0 are turned on, and the transistors TR1 to TR13 in the other row decoders RD are turned off. That is, a current path is formed between the interconnects provided in the block BLK0 and the corresponding signal lines, and a current path is cut off between the interconnects provided in the other blocks BLK and the corresponding signal lines. As a result, the voltages applied to the signal lines by the voltage generation circuit 19 are applied to the interconnects provided the selected block BLK0 via the row decoder RD0, respectively.

[1-1-5] Circuit of Sense Amplifier Module 13

Figure 5:
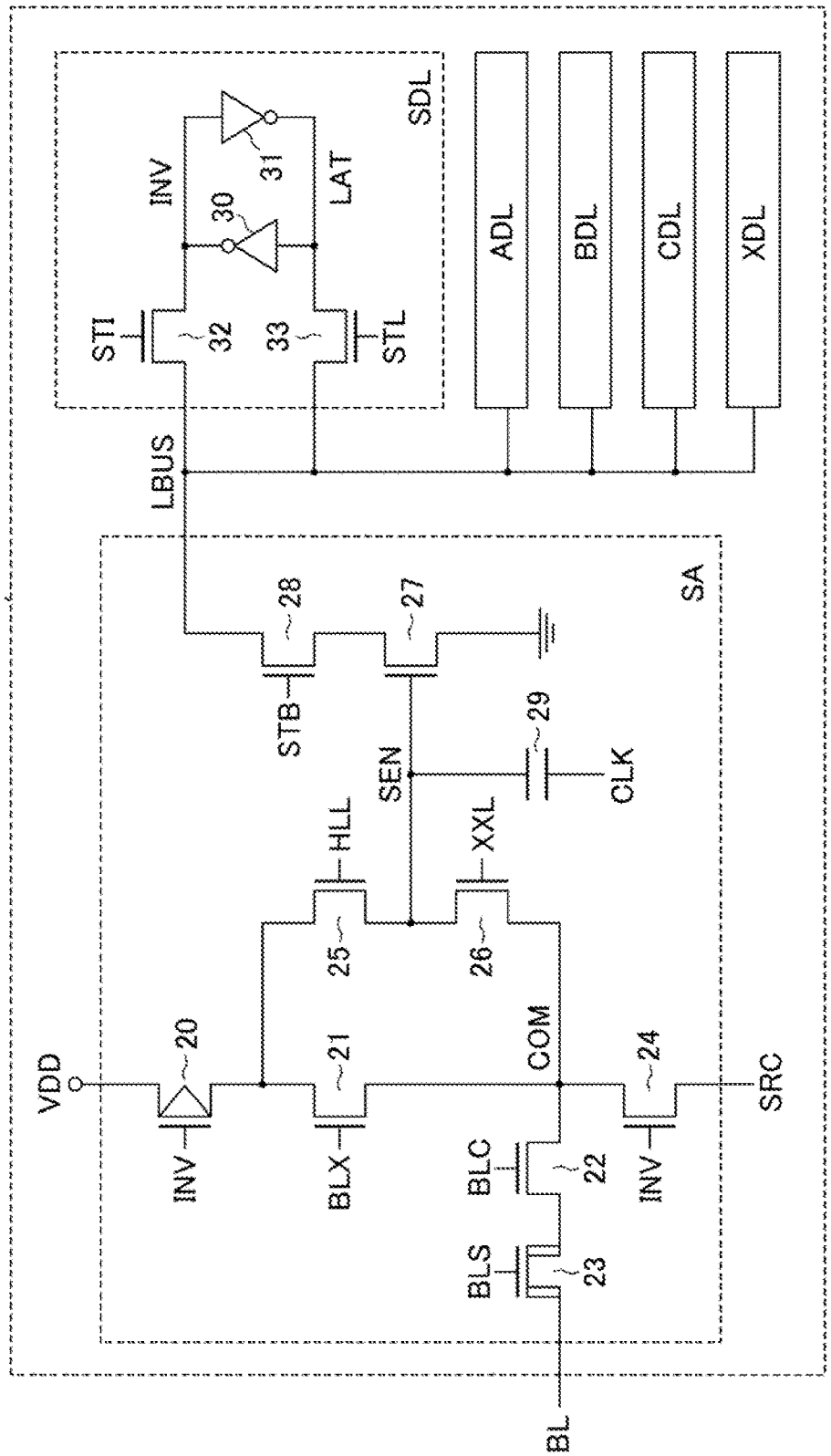
FIG. 5 is a circuit diagram of a sense amplifier module in a first embodiment.

FIG. 5 illustrates an example of a circuit of the sense amplifier module 13 in the first embodiment. The sense amplifier module 13 includes a plurality of sense amplifier units SAU respectively associated with the bit lines BL0 to BLm, and a detailed circuit of one extracted sense amplifier unit SAU is illustrated in FIG. 5.

As illustrated in FIG. 5, the sense amplifier unit SAU includes a sense amplifier SA and latch circuits SDL, ADL, BDL, CDL, and XDL. The sense amplifier SA and the latch circuits SDL, ADL, BDL, CDL, and XDL are connected to each other through a bus LBUS so that data can be transmitted and received to/from each other.

In the read operation, for example, the sense amplifier SA senses the data read to the corresponding bit line BL and determines whether the read data is "0" or "1". The sense amplifier SA includes, for example, a p-channel MOS transistor 20, n-channel MOS transistors 21 to 28, and a capacitor 29.

One end of the transistor 20 is connected to a power supply line, and a gate of the transistor 20 is a connected to node INV of the latch circuit SDL. One end of the transistor 21 is connected to the other end of the transistor 20, the other end of the transistor 21 is connected to node COM, and a control signal BLX is input to a gate of the transistor 21. One end of the transistor 22 is connected to the node COM, and a control signal BLC is input to a gate of the transistor 22. The transistor 23 is a MOS transistor having a high breakdown voltage, one end of the transistor 23 is connected to the other end of the transistor 22, the other end of the transistor 23 is connected to the corresponding bit line BL, and a control signal BLS is input to a gate of the transistor 23.

One end of the transistor 24 is connected to node COM, the other end of the transistor 24 is connected to node SRC, and a gate of the transistor 24 is connected to node INV (of data latch SDL). One end of the transistor 25 is connected to the other end of the transistor 20, the other end of the transistor 25 is connected to node SEN, and a control signal HLL is input to a gate of the transistor 25. One end of the transistor 26 is connected to the node SEN, the other end of the transistor 26 is connected to the node COM, and a control signal XXL is input to a gate of the transistor 26.

One end of the transistor 27 is grounded, and a gate of the transistor 27 is connected to the node SEN. One end of the transistor 28 is connected to the other end of the transistor 27, the other end of the transistor 28 is connected to the bus LBUS, and a control signal STB is input to a gate of the transistor 28. One end of the capacitor 29 is connected to the node SEN, and a clock CLK is input to the other end of the capacitor 29.

The control signals BLX, BLC, BLS, HLL, XXL, and STB described above are generated by the sequencer 17, for example. Further, a voltage VDD, which is, for example, an internal power supply voltage of the semiconductor memory device 10, is applied to the power supply line connected to one end of the transistor 20, and a voltage VSS, which is, for example, a ground voltage of the semiconductor memory device 10, is applied to the node SRC.

The latch circuits SDL, ADL, BDL, CDL, and XDL temporarily stores read data. The latch circuit XDL is connected to the input/output circuit 14, and is used to input and output data between the sense amplifier unit SAU and the input/output circuit 14.

The latch circuit SDL includes, for example, inverters 30 and 31 and n-channel MOS transistors 32 and 33. An input node of the inverter 30 is connected to a node LAT and an output node of the inverter 30 is connected to a node INV. An input node of the inverter 31 is connected to the node INV, and an output node of the inverter 31 is connected to the node LAT. One end of the transistor 32 is connected to the node INV, the other end of the transistor 32 is connected to the bus LBUS, and a control signal STI is input to a gate of the transistor 32. One end of the transistor 33 is connected to the node LAT, the other end of the transistor 33 is connected to the bus LBUS, and a control signal STL is input to a gate of the transistor 33. The data stored in the node LAT corresponds to data stored in the latch circuit SDL, and the data stored in the node INV corresponds to inverted data of the data stored in the node LAT. Circuit of the latch circuits ADL, BDL, CDL, and XDL are the same as the circuit of the latch circuit SDL, for example, and thus the description thereof will not be presented.

In the sense amplifier module 13 described above, a timing at which each sense amplifier unit SAU determines the data read to the bit line BL is based on a timing at which the control signal STB is asserted. In the specification, the meaning of "the sequencer 17 asserts the control signal STB" means that the sequencer 17 changes the control signal STB from the "L" level to the "H" level.

In addition to such an embodiment, any sense amplifier module 13 may be used in the first embodiment. In the sense amplifier unit SAU, for example, the transistor 28 in which the control signal STB is input to the gage may be a p-channel MOS transistor. In this case, the meaning of "the sequencer 17 asserts the control signal STB" means that the sequencer 17 changes the control signal STB from the "H" level to the "L" level.

In addition, for example, the number of latch circuits in the sense amplifier unit SAU can be freely designed. In this case, the number of latch circuits can be designed based on the number of bits of data stored in each memory cell transistor MT, for example. Further, one sense amplifier unit SAU may be connected to a plurality of bit lines BL via a selector.

[1-2] Operation

[1-2-1] Outline of Write Operation

The semiconductor memory device 10 according to the first embodiment repeatedly executes a software program loop within the write operation. The software program loop includes a program operation and a verification operation. The program operation is an operation for increasing the threshold voltage of a memory cell transistor MT to a desired level set according to the data values being written to the memory cell transistor. The verification operation is an operation for determining whether the just programmed threshold voltage of the memory cell transistor MT exceeds the intended voltage (that is, whether or not the intended data has been successfully written to the memory cell transistor MT in the preceding program operation).

In the following description, the sense amplifier unit SAU, which stores data corresponding to the "A" level and writes the data to the corresponding memory cell transistor MT in the write operation, is referred to as an "A" write sense amplifier unit SAU. The bit line BL connected to the "A" write sense amplifier unit SAU is referred to as an "A" write bit line BL.

In the following description, the memory cell transistor MT for which the threshold voltage is to be raised by the program operation is referred to as a write-target memory cell transistor MT. The memory cell transistor MT for which the threshold voltage is to be left unchanged is referred to as protected or a write-protect memory cell transistor MT. The read operation by which it is determined whether the threshold voltage of the memory cell transistor MT exceeds the "A" level in the verification operation is referred as an "A" verification for simplicity.

These designations are similarly defined for each the "B" level, the "C" level, the "D" level, the "E" level, the "F" level, and the "G" level.

Figure 6:
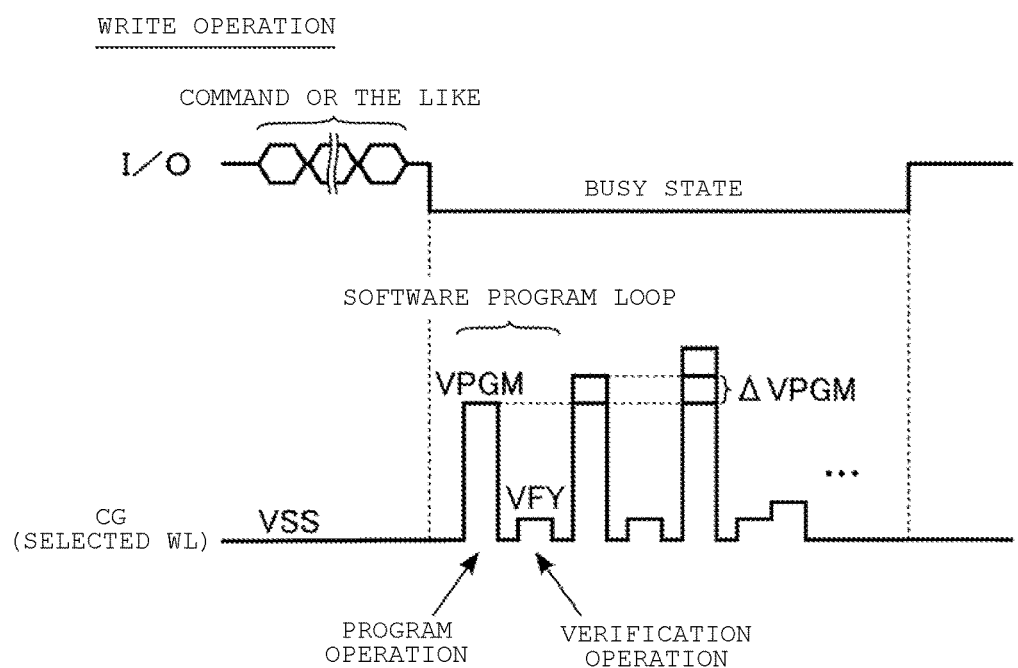
FIG. 6 is a timing chart illustrating an example of signals and voltages of interconnects in a write operation of the semiconductor memory device according to a first embodiment.

FIG. 6 is an example of a voltage of each interconnect in the write operation of the semiconductor memory device 10 according to the first embodiment, and illustrates a state of an input and output signal I/O and a voltage of a single line CG corresponding to a selected word line WL. The input and output signal I/O indicates the semiconductor memory device 10 receives a command or the like from the external memory controller over some time period after which the semiconductor memory device 10 is in a busy state.

As illustrated in FIG. 6, the command transmitted by the external memory controller is received in the input and output signal I/O. Specifically, the semiconductor memory device 10 receives a command instructing execution of a write operation, an address of a memory cell for storing data, and write data from the external memory controller. Upon receiving the command, the address, and the data, the semiconductor memory device 10 transitions to a busy state from a ready state and then executes the write operation as instructed.

In the write operation, first, the sequencer 17 executes a program operation. Specifically, the sense amplifier module 13 applies a voltage VSS to the bit line BL of the write-target memory cell transistor MT, and applies a voltage VINH to the bit line of the write-protect memory cell transistor(s) MT. The voltage VINH is higher than the voltage VSS, and an NAND string NS connected to a bit line BL applied with the voltage VINH is in a floating state, for example. At the start of the write operation, any memory cell transistor MT which is to have the "ER" level after the writing operation is set to be write protected.

Then, the voltage generation circuit 19 applies a program voltage VPGM to the signal line CG. The program voltage VPGM is a voltage capable of injecting electrons into the charge storage layer of a memory cell transistor MT. The program voltage VPGM applied to the signal line CG is ultimately applied to the selected word line WL via the row decoder module 12.

Then, in the write-target memory cell transistor MT, electrons are injected into the charge storage layer due to the gate-to-channel potential difference and the threshold voltage of the memory cell transistor MT rises. In the write-protect memory cell transistor (s) MT, on the other hand, the channel of the NAND string NS is in the floating state and is boosted such that the gate-to-channel potential difference is small and an increase in the threshold voltage of the write-protected memory cell transistor(s) MT is prevented.

Next, the sequencer 17 executes a verification operation. Specifically, the voltage generation circuit 19 applies a verification voltage VFY to the signal line CG. As the verification voltage VFY, for example, the verification voltage AV illustrated in FIG. 3 is used. The verification voltage VFY applied to the signal line CG is ultimately applied to the selected word line WL via the row decoder module 12.

Then, the memory cell transistor MT connected to the selected word line WL is turned on or off according to its threshold voltage setting. Each sense amplifier unit SAU determines, based on the voltage of the corresponding bit line BL, whether the threshold voltage of the connected memory cell transistor MT exceeds a desired verification voltage.

Then, if memory cell transistor MT exceeds the desired verification voltage, then the sequencer 17 determines that the verification of the memory cell transistor MT is passed, and this now successfully programmed memory cell transistor MT will be set as write protected in subsequent program operations.

On the other hand, if the threshold voltage of memory cell transistor MT is equal to or less than the desired verification voltage, the sequencer 17 determines that the verification of the memory cell transistor MT has failed, and the memory cell transistor MT remains as a write target in the next program operation (with a higher or stepped up program voltage VPGM).

The sequencer 17 may consecutively apply a plurality different verification voltages from the voltage generation circuit 19 within the sequence of a single verification operation, and can thus allow the sense amplifier module 13 to consecutively perform verifications at a plurality of levels. Furthermore, the sequencer 17 can appropriately change the verification voltages to be applied in the single verification operation depending on the current progress of the write operation. The sequencer 17 may apply one type of verification voltage to the voltage generation circuit 19 in the single verification operation and allow the sense amplifier module 13 to execute verification of only one level.

The operation pair of a program operation followed by a verification operation as described above corresponds to a single software program loop or more simply referred to as a program loop. The sequencer 17 repeatedly executes such a software program loop, and steps up the program voltage VPGM by AVPGM for each iteration of the software program loop until successful verification or otherwise some predetermined limit. Then, once the software program loop has repeatedly executed several times (for example, 19 times), the sequencer 17 finishes the write operation and causes the semiconductor memory device 10 to transition from the busy state to the ready state.

When detecting that the number of memory cell transistors MT which have passed the verification has become less than some predetermined number, the sequencer 17 may finished the write operation and cause the semiconductor memory device 10 to transition from the busy state to the ready state.

In a case of using an ISPP (Incremental Step Pulse Program) system, a step-up width ΔVPGM of the program voltage VPGM may be, for example, about 0.8 V or other values. Further, the time for the write operation may be set to a range from 1200 to 3500 μs, for example, or other ranges.

[1-2-1] Details of Verification Operation

Regarding to the details of the verification operation in the semiconductor memory device 10 according to the first embodiment, a case in which an "A" verification and a "B" verification are consecutively executed within a single verification operation of a program loop will be described below with reference to FIGS. 7 to 12.

Figure 7:
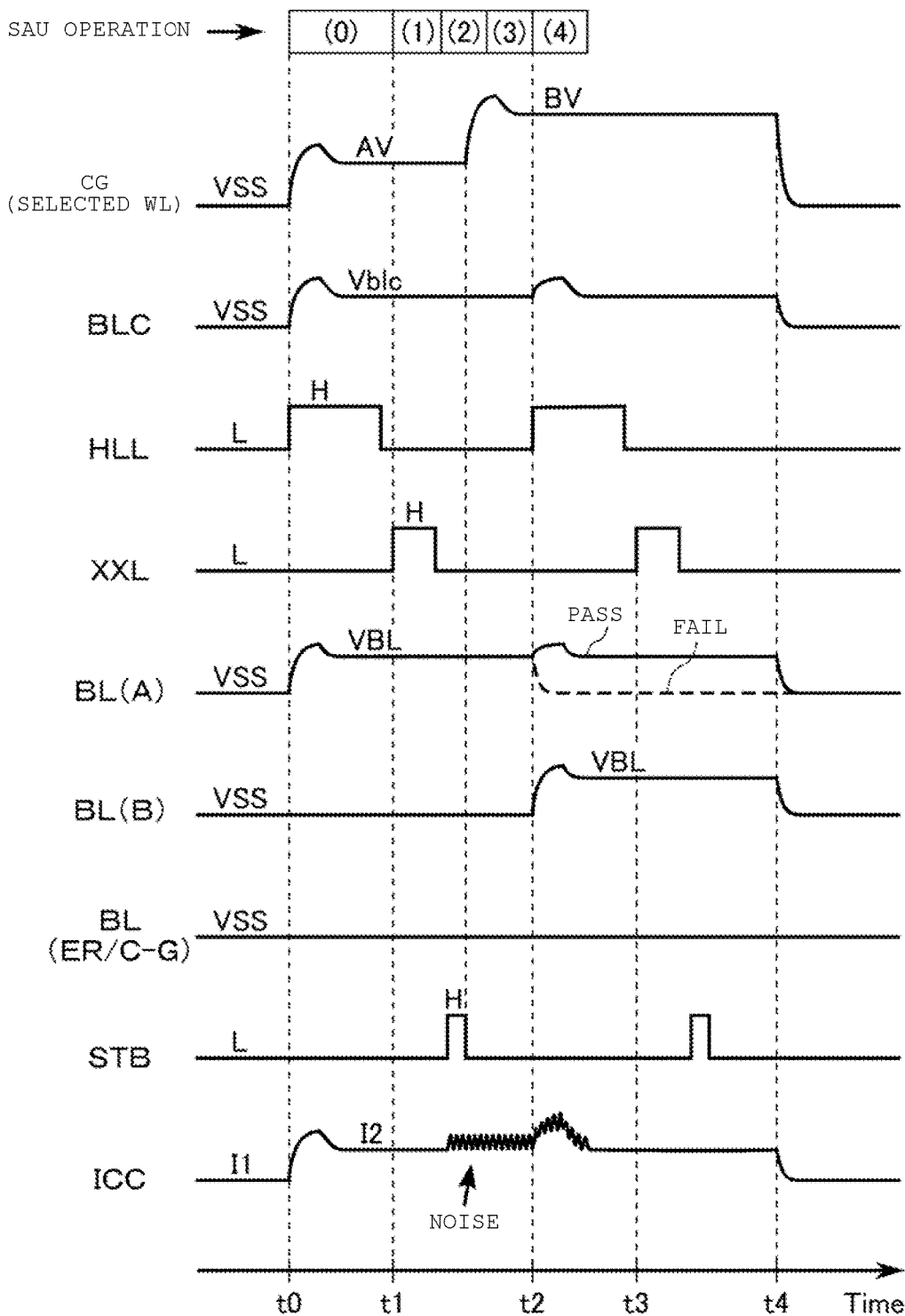
FIG. 7 is a timing chart illustrating an example of voltages and currents of interconnects in a verification operation of the semiconductor memory device according to a first embodiment.

FIG. 7 is an example of voltages and currents of respective interconnects in the verification operation of the semiconductor memory device 10 according to the first embodiment, and illustrates voltages of a signal line CG corresponding to the selected word line WL and control signals BLC, HLL, XXL, and STB, voltages of bit lines BL at respective write levels, and a current of a power supply current ICC. The power supply current ICC corresponds to, for example, a current flowing through a terminal through which the power supply voltage VCC is applied to the semiconductor memory device 10, and can be regarded as, for example, current consumption of the semiconductor memory device 10. Further, the amount of power supply currents ICC varies depending on the change in voltage of the control signal BLC, for example.

FIGS. 8 to 12 are examples of operations of the latch circuits SDL, ADL, BDL, and CDL in the verification operation of the semiconductor memory device 10 according to the first embodiment, and illustrates status of the latch circuits SDL, ADL, BDL, and CDL and the node SEN in the sense amplifier unit SAU corresponding to the respective write levels. FIGS. 8 to 12 illustrate operations at the periods (0) to (4) illustrated in FIG. 7, respectively.

In the first embodiment, when the latch circuit in the sense amplifier unit SAU stores data corresponding to the "ER" level, the corresponding memory cell transistor MT is set to be write protected.

In addition, when the latch circuit SDL in the sense amplifier unit SAU stores data of "1", the transistor 20 is turned on, and the bit line BL corresponding to the sense amplifier unit SAU is charged. On the other hand, when the latch circuit SDL stores data of "0", the transistor 20 is turned off, and the supply of the current to the bit line BL corresponding to the sense amplifier unit SAU is cut off. That is, the data of "1" stored in each latch circuit corresponds to a voltage of an "H" level (first logic level), and the data "0" corresponds to a voltage of a "L" level (second logic level).

As illustrated in FIG. 7, for example, before a time to, the voltages of the signal line CG and the control signal BLC are set as a voltage VSS, the voltages of the control signals HLL, XXL, and STB are set as "L" level, and the voltage of the bit line BL is set at voltage VSS. In addition, the power supply current ICC is set as I1.

At the time t0, the sequencer 17 sets any "A" write bit line BL to be charged as illustrated in FIG. 8, and sets the other bit lines BL not to be charged (SAU Operation state (0) in FIG. 7).

Specifically, the sequencer 17 sets the data stored in the latch circuit SDL of the "A" write sense amplifier unit SAU to "1" and sets the data stored in the latch circuits SDL of the other sense amplifier units SAU to "0".

For the write data received from the external memory controller, the lower-order bit data is stored in the latch circuit ADL, the middle-order bit data is stored in the latch circuit BDL, and the higher-order bit data is stored in the latch circuit CDL. However, the particular latch circuits used to store the different order write data in a sense amplifier unit SAU can be set to an arbitrary combination.

The voltage generation circuit 19 applies the verification voltage AV to the signal line CG corresponding to the selected word line WL. The verification voltage AV applied to the signal line CG is applied to the selected word line WL via the row decoder module 12.

The sequencer 17 sets the voltage of the control signal BLC to a voltage Vblc. The transistor 22, to which the voltage Vblc is applied, is turned on, and each sense amplifier unit SAU applies a voltage to the corresponding bit line BL according to the write data stored in the internal latch circuit.

Specifically, the "A" write sense amplifier unit SAU applies the voltage VBL to the corresponding bit line BL. The voltage VBL is, for example, a voltage applied to the bit line BL in the read operation. When the voltage of the bit line BL rises, the amount of currents flowing through the source line SL increases, so that the power supply current ICC rises to, for example, I2 according to the potential variation on the bit line BL.

In addition, the sequencer 17 sets the control signal HLL to the "H" level. When the control signal HLL becomes the "H" level, the transistor 25 is turned on, and the node SEN is charged. Then, when the node SEN is completely charged, the sequencer 17 sets the control signal HLL to the "L" level.

At the time t0, the sequencer 17 may execute a kick operation on the signal line CG and the control signal BLC as illustrated in FIG. 7. The kick operation is a voltage applying method of temporarily setting a drive voltage of a driver to a value higher than a target voltage value and then lowering the applied voltage to the target voltage value. For example, when the kick operation is executed on the control signal BLC, the amount of currents to be supplied to the bit line BL increases, and the bit line BL is temporarily charged to a voltage higher than the target voltage value.

At the time t1, the sequencer 17 sets the control signal XXL to the "H" level. When the control signal XXL becomes the "H" level, a potential of the node SEN varies as illustrated in FIG. 9, based on the state of the memory cell transistor MT connected to the selected word line WL (SAU Operation State (1) in FIG. 7).

Specifically, the node SEN is in a state corresponding to the data "0" when the memory cell transistor MT corresponding to the sense amplifier unit SAU is turned on. The node SEN is in a state corresponding to the data of "1" when the OFF state is maintained.

Next, the sequencer 17 sets the control signal XXL to the "L" level and then asserts the control signal STB. When the control signal STB is asserted, the "A" write sense amplifier unit SAU executes the "A" verification based on the status of the node SEN, and stores the sense result (the verification result) in the internal latch circuit SDL as illustrated in FIG. 10 (SAU Operation State (2) in FIG. 7).

Specifically, when the node SEN is in the state corresponding to data "1" in the "A" write sense amplifier unit SAU, the data stored in the latch circuit SDL is maintained at "1" (verification pass), and when the node SEN is in the state corresponding to data "0", the data stored in the latch circuit SDL is updated to "0" (verification fail).

Further, the voltage generation circuit 19 applies the verification voltage BV to the signal line CG, for example, when the control signal STB is asserted and is returned to the "L" level. The verification voltage BV applied to the signal line CG is applied to the selected word line WL via the row decoder module 12. The timing at which the voltage generation circuit 19 applies the verification voltage BV to the signal line CG may be set, for example, from a timing at which the control signal STB is asserted to the time t2.

Next, as illustrated in FIG. 11, the sequencer 17 sets the "B" write bit line (s) BL to be charged (SAU Operation State (3) in FIG. 7). Specifically, the sequencer 17 updates data stored in the latch circuit SDL in the "B" write sense amplifier unit SAU to "1". At this time, the sense result (data of "1") for the "A" verification presently stored in the latch circuit SDL in the "A" write sense amplifier unit SAU is maintained as it is.

Then, at the time t2, the bit line BL corresponding to the sense amplifier unit SAU for which data of "1" is stored in the latch circuit SDL is charged. Specifically, the bit line BL corresponding to the sense amplifier unit SAU that has passed the "A" verification and the bit line BL corresponding to the "B" write sense amplifier unit SAU are both set to be charged. At this time, the bit line BL corresponding to the sense amplifier unit SAU in which the "A" verification has failed is set not to be charged.

Meanwhile, in parallel with the charging of the bit line BL at the time t2, the sequencer 17 reflects the sense result of the "A" verification process in a latch circuit of the "A" write sense amplifier unit SAU as illustrated in FIG. 12 (SAU Operation State (4) in FIG. 7).

Specifically, when data is allocated as illustrated in FIG. 3, the sequencer 17 obtains a logical sum of the data stored in the latch circuit SDL and the data stored in the latch circuit BDL, obtains a logical sum of the arithmetic operation result of the logical sum and the data stored in the latch circuit ADL, and updates the data stored in the latch circuit ADL according to the arithmetic operation result of the logical sum. Thus, when the "A" verification is passed, the data stored in the latch circuits ADL, BDL, and CDL in the corresponding sense amplifier unit SAU is updated to the data similar to the "ER" level.

As a result, the bit line BL corresponding to the sense amplifier unit SAU in which the "A" verification has passed, is also set not to be charged in the subsequent verification operation(s). In other words, the memory cell transistor MT corresponding to the sense amplifier unit SAU for which the "A" verification has passed is not subject to the programming process in subsequent program operation(s).

At the time t2, the sequencer 17 sets the control signal HLL to the "H" level. When the control signal HLL becomes the "H" level, the transistor 25 is turned on, and the node SEN is charged. Then, when the node SEN is completely charged, the sequencer 17 sets the control signal HLL to the "L" level. At the time t2, the sequencer 17 may execute a kick operation on the signal line CG and the control signal BLC as illustrated in FIG. 7.

As described above, the latch circuit in the sense amplifier unit SAU operates during each of the periods (2) to (4) illustrated in FIG. 7. At this time, charging and discharging to/from the bus LBUS is performed due to the transmission and reception of the data to/from or between the latch circuits SDL, ADL, BDL, CDL, and XDL, and thus the power supply current ICC increases. Since the frequency of the current changes at this time is typically higher than that of a current change generated by other operations, it may look like noise. As a result, for example, the fluctuation of the power supply current ICC in the periods (2) to (4) illustrated in FIG. 7 is larger than the fluctuation of the power supply current ICC in the period (1) illustrated in FIG. 7, for example.

At the time t3, the sequencer 17 sets the control signal XXL to the "H" level. When the control signal XXL becomes the "H" level, the potential of the node SEN varies depending on the state of the memory cell transistor MT connected to the selected word line WL.

Next, the sequencer 17 sets the control signal XXL to the "L" level, and then asserts the control signal STB. When the control signal STB is asserted, the "B" write sense amplifier unit SAU executes the "B" verification based on the status of the node SEN, and stores the sense result in the internal latch circuit SDL. Then, the sequencer 17 reflects the result of the "B" verification in the latch circuit in the "B" write sense amplifier unit SAU.

At a time t4, the sequencer 17 sets the voltage of the signal line CG and the voltage of the control signal BLC to VSS, and finishes the verification operation.

As described above, when the verification for the plurality of levels is consecutively performed within the same verification operation in the semiconductor memory device 10 according to the first embodiment, the bit line BL corresponding to the memory cell transistor MT which has just passed verification in the previous verification operation, is charged during the verification at the subsequent verification level.

In other words, in the first embodiment, only those bit line BL connected to memory cell transistors MT which must be verified at the first verification level (the verification level which is executed first within the single verification operation) are charged for the verification at the first verification level, and, in the next, or subsequent, verification at the next verification level (e.g., "B" level) within the single verification process, the bit line BL connected to memory cell transistors MT to be verified at the next verification level and the bit line BL connected to the memory cell transistor MT that have passed the verification at a prior verification level (e.g., "A") are charged in the verification at this next level.

Specifically, for example, when the "A" verification, the "B" verification, and the "C" verification are to be consecutively executed in a single verification operation, the "A" write bit line BL is charged during the "A" verification. During the "B" verification, the "B" write bit line BL and those bit line BL corresponding to the memory cell transistors MT which passed the "A" verification are charged. During the "C" verification, the "C" write bit line BL and those bit line BL corresponding to the memory cell transistor MT which passed the "B" verification are charged.

In FIG. 7, there is a depicted time lag between the times t1 and t2 and between the times t3 and t4 until the control signal STB is asserted after the control signal XXL becomes the "L" level, but the disclosure is not limited thereto. For example, the timing at which the control signal XXL becomes the "L" level may be the same as the timing at which the control signal STB is asserted.

[1-3] Effects of First Embodiment

According to the semiconductor memory device 10 of the first embodiment described above, the write operation can be performed at a high speed. Detailed effects of the semiconductor memory device 10 according to the first embodiment will be described below.

In the write operation of a semiconductor memory device, the conventional method of related art charges all the bit line BL at the time of the verification operation and execute the verification for each level. Such a verification operation can typically operate at a high speed but simply controlling the sense amplifier module 13 in this manner consumes a large amount of current.

The current consumption during a conventional verification operation is lowered due to the need to charge only the particular bit lines BL necessary for verification at each particular verification level. Here, a verification operation according to a comparative example will be described with reference to FIGS. 13 to 15.

Figure 13:
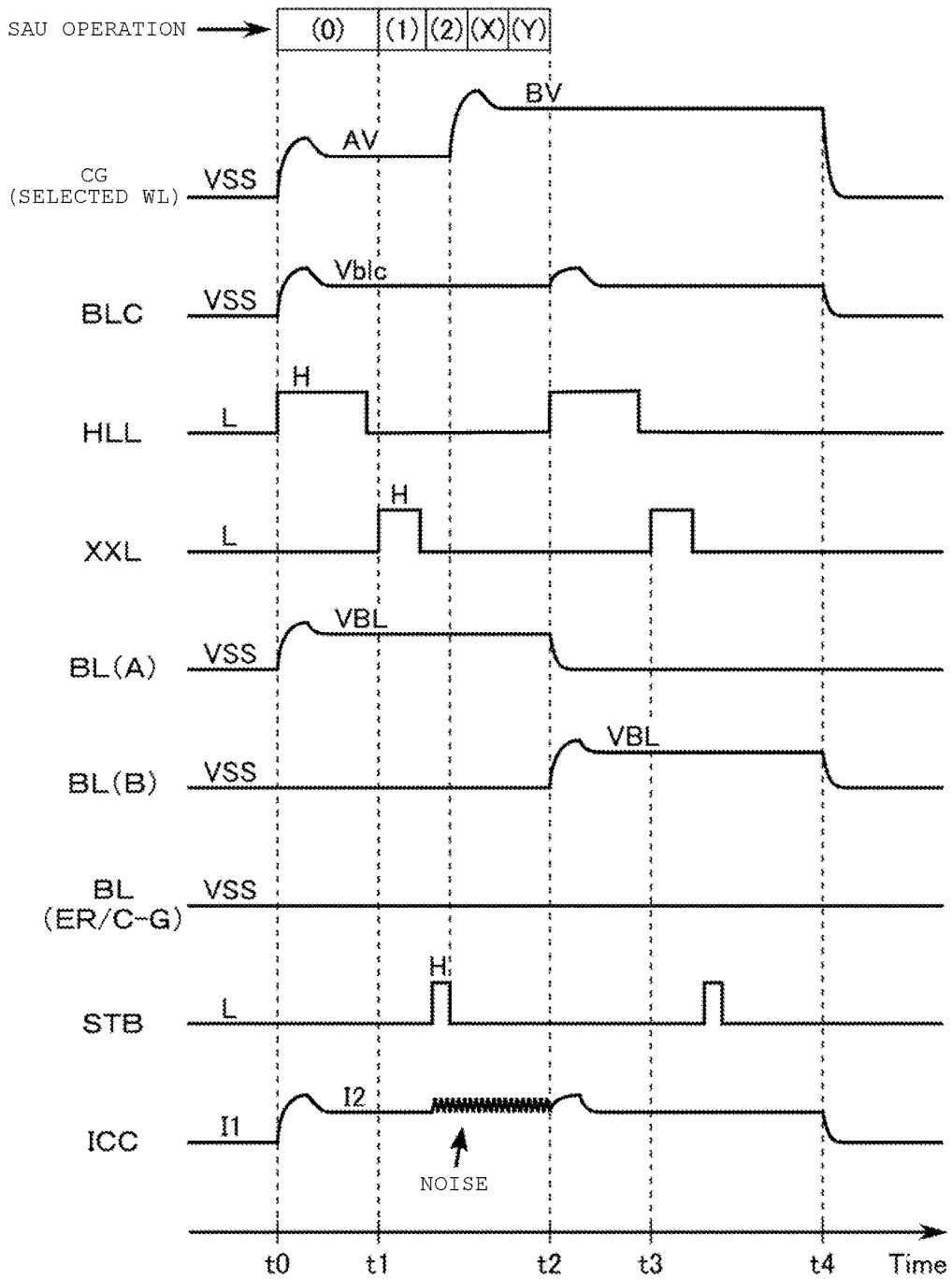
FIG. 13 is a timing chart illustrating an example of voltages and currents of respective interconnects in a verification operation of a semiconductor memory device according to a comparative example.

FIG. 13 illustrates an example of voltages and currents of respective interconnects in the verification operation according to the comparative example of the first embodiment. FIGS. 14 and 15 illustrate examples of operations of latch circuits SDL, ADL, BDL, and CDL in the verification operation of the comparative example, and illustrate operations at periods (X) and (Y) illustrated in FIG. 13.

In the verification operation according to the comparative example, as illustrated in FIG. 13, the operation periods (3) and (4) in FIG. 7 described in the first embodiment are replaced with operation periods (X) and (Y), respectively, and the kick operation of the control signal BLC at the time t2 illustrated in FIG. 7 is executed after the operation (Y).

Specifically, in the verification operation of the comparative example, after a control signal STB is asserted, a sense result (verification result) of "A" verification stored in the latch circuit SDL in an "A" write sense amplifier unit SAU is reflected (mirrored) in another latch circuit as illustrated in FIG. 14 (operation period (X) in FIG. 13).

Then, as illustrated in FIG. 15, a sequencer 17 sets a "B" write bit line BL to be charged, sets the "A" write bit line BL not to be charged (operation (Y) in FIG. 13), and shifts to an operation at a time t2. That is, the sequencer 17 updates the data stored in the latch circuits SDL of the "A" write sense amplifier unit SAU and the "B" write sense amplifier unit SAU to "0" and "1", respectively, and shifts to the operation at the time t2.

At the time t2, each sense amplifier unit SAU applies a voltage to the corresponding bit line BL according to the write data stored in the internal latch circuit. Specifically, the "B" write sense amplifier unit SAU applies a voltage VBL to the corresponding bit line BL. At this time, the "A" write sense amplifier unit SAU lowers the voltage of the corresponding bit line BL to VSS from VBL.

In the verification operation of the comparative example, only the bit line BL corresponding to the particular level at which the verification is being executed is charged in the verification operation, and the verification at each level is executed in this manner consecutively. In the verification operation of the comparative example, since information on the bit line BL to be charged in the verification at the subsequent level must still be stored in the latch circuit SDL after the sense result stored in the latch circuit SDL is reflected in another latch circuit, the time of the verification operation becomes as long as at least the time required for data to transfer between latch circuits. That is, in the comparative example, since the next bit line BL to be verified (at next verification level) is not charged until the operation (Y) in FIG. 13 is completed, the starting of the verification at the next level must wait until this later time.

In the semiconductor memory device 10 according to the first embodiment, the information on the bit line BL to be charged in the verification of the next level is stored in the latch circuit SDL in a state where the sense result is left before the sense result stored in the latch circuit SDL is reflected in another latch circuit in the sense amplifier unit SAU in the verification operation.

In the semiconductor memory device 10 according to the first embodiment, the sense result in the verification of the previous level is reflected in another latch circuit from the latch circuit SDL in parallel with the charging of the bit line BL in the verification for the next level. In order words, in the first embodiment, after the operation (3) in FIG. 7 is completed, the bit line BL can be charged at the time t2 in parallel with the operation (4) in FIG. 7.

In the verification operation of the first embodiment, the timing for charging the bit line BL in the consecutive verifications can be made faster as compared to the comparative example. Specifically, the period from the time t1 to the time t2 illustrated in FIG. 7 for the first embodiment can be shorter than the period from the time t1 to the time t2 illustrated in FIG. 13 for the comparative example.

In the semiconductor memory device 10 according to the first embodiment, the time required for the verification operation in the write operation can be shortened compared to the comparative example. Accordingly, the semiconductor memory device 10 according to the first embodiment can perform the write operation at a higher speed.

The verification operation of the first embodiment also differs from the verification operation of the comparative example in terms of the current consumption. FIG. 16 is an example of a relation between the write level and the bit lines charged in the verification operation in the first embodiment and the comparative example, and illustrates a case of consecutively executing "A" verification, "B" verification, "C" verification, "D" verification, "E" verification, "F" verification, and "G" verification within a single verification operation.

As illustrated in FIG. 16, the combination of the bit line BL to be charged in the "A" verification is the same in the first embodiment and the comparative example. However, the combinations of the bit lines BL to be charged respectively in the "B" verification, the "C" verification, the "D" verification, the "E" verification, the "F" verification, and the "G" verification are larger in the first embodiment than in the comparative example.

Specifically, in the verification operation of the first embodiment compared to the verification operation of the comparative example, as the bit line BL corresponding to the memory cell transistors MT which have passed the verification just before each of the "B" verification, the "C" verification, the "D" verification, the "E" verification, the "F" verification, and the "G" verification, are also charged, the current consumption is increased.

However, in general, the number of the bit lines BL corresponding to the memory cell transistors MT which have passed the previous verification is small as percentage of all bit lines BL. Therefore, the semiconductor memory device 10 according to the first embodiment can perform the write operation at a high speed and prevent a substantial increase in current consumption above that of the comparative example.

The verification operation of the first embodiment may be distinguished from the verification operation of the comparative example by detecting the apparent noise which occurs in the power supply current ICC due to the operations of the latch circuit in the sense amplifier unit SAU.

Specifically, in the verification operation of the first embodiment, as illustrated in FIG. 7, when the kick operation of the control signal BLC is executed in the "B" verification, the noise caused by the operation of the latch circuit in the sense amplifier unit SAU in the operation period (4) in FIG. 7 occurs in the power supply current ICC.

On the other hand, in the verification operation of the comparative example, as illustrated in FIG. 13, the operation of the sense amplifier unit SAU corresponding to the operations (X) and (Y) in FIG. 13, which are the cause of occurrence of noise, is finished before the kick operation of the control signal BLC is executed in the "B" verification. Thus, the noise due to the operation of the latch circuit does not occur during the kick operation of the control signal BLC.

That is, it may be possible to determine whether the verification operation of the first embodiment is being executed by checking whether the noise due to the operation of the latch circuit occurs in the power supply current ICC during the kick operation of the control signal BLC rather than only before.

FIGS. 7 and 13 illustrate the case where the noise occurs in the power supply current ICC only during the period in which the latch circuit in the sense amplifier unit SAU operates, but the disclosure is not limited thereto. For example, the noise may occur in other periods; however, in general, the noise occurring in other periods is relatively smaller than the noise occurring during the period in which the latch circuit in the sense amplifier unit SAU operates.

[2] Second Embodiment

In a semiconductor memory device 10 according to a second embodiment, a sense amplifier unit SAU includes many latch circuits as compared to the semiconductor memory device 10 according to the first embodiment. A verification operation of the second embodiment differs from the verification operation of the first embodiment in terms of the control method of the latch circuits. Differences of the semiconductor memory device 10 according to the second embodiment from the semiconductor memory device 10 according to the first embodiment will be described below.

[2-1] Configuration

Figure 17:
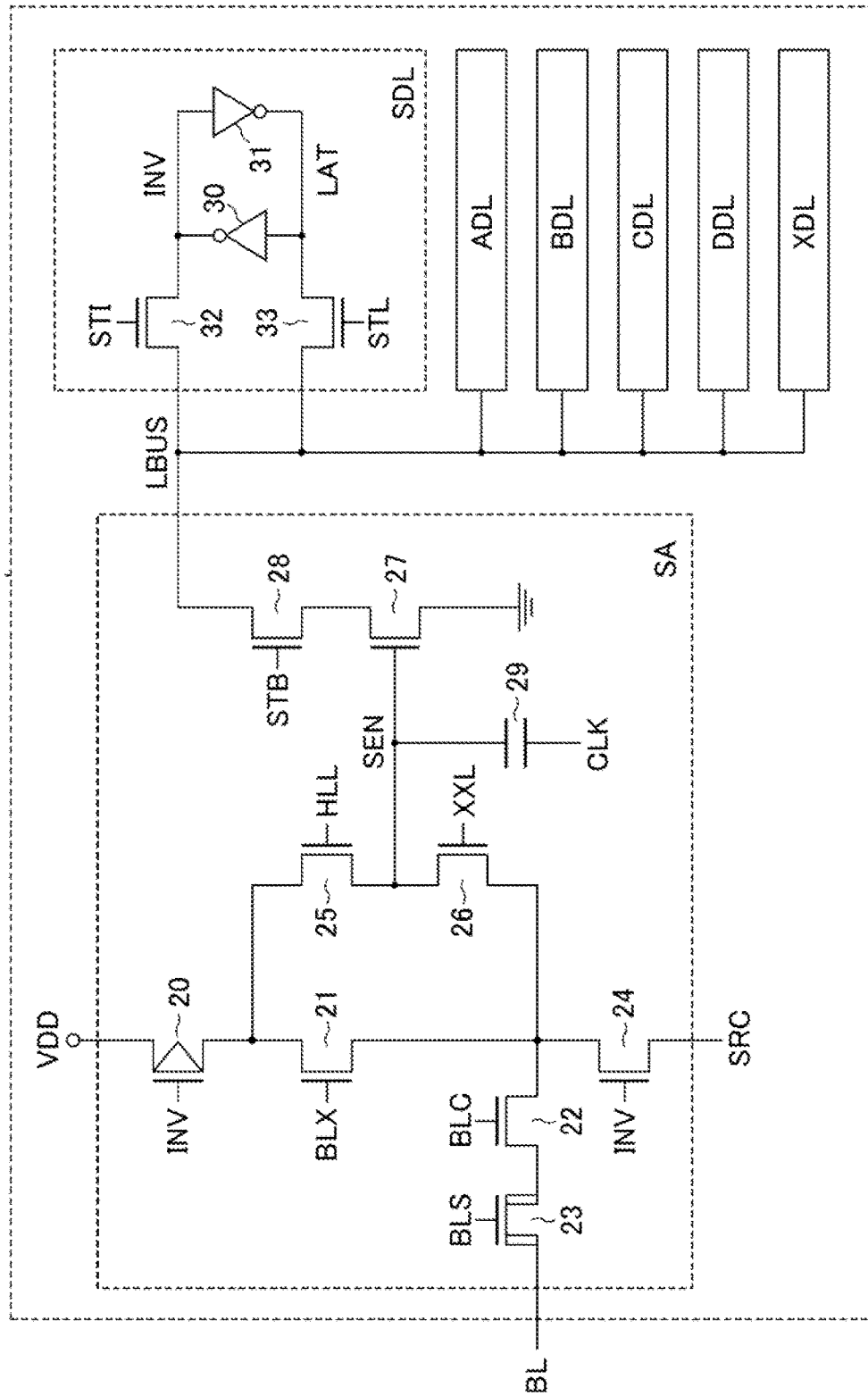
FIG. 17 is a circuit diagram of a sense amplifier module in a second embodiment.

FIG. 17 is an example of a circuit configuration of a sense amplifier module 13 of the second embodiment and illustrates a detailed circuit configuration of one sense amplifier unit SAU.

As illustrated in FIG. 17, the sense amplifier unit SAU of the second embodiment further includes a latch circuit DDL in addition to the configuration of the sense amplifier unit SAU described with reference to FIG. 5 in the first embodiment.

The latch circuit DDL has the same configuration as the latch circuits ADL, BDL, and CDL, for example, and is connected to a bus LBUS. That is, the latch circuit DDL can transmit and receive data to and from the sense amplifier SA and the latch circuits SDL, ADL, BDL, CDL, and XDL. Other configurations of the semiconductor memory device 10 according to the second embodiment are the same as those of the semiconductor memory device 10 according to the first embodiment, and thus the description thereof will not be presented.

[2-2] Operation

Regarding to details of a verification operation in the semiconductor memory device 10 according to the second embodiment, a case in which an "A" verification and a "B" verification are consecutively executed in a single verification operation will be described below with reference to FIGS. 18 to 23, as an example.

Figure 18:
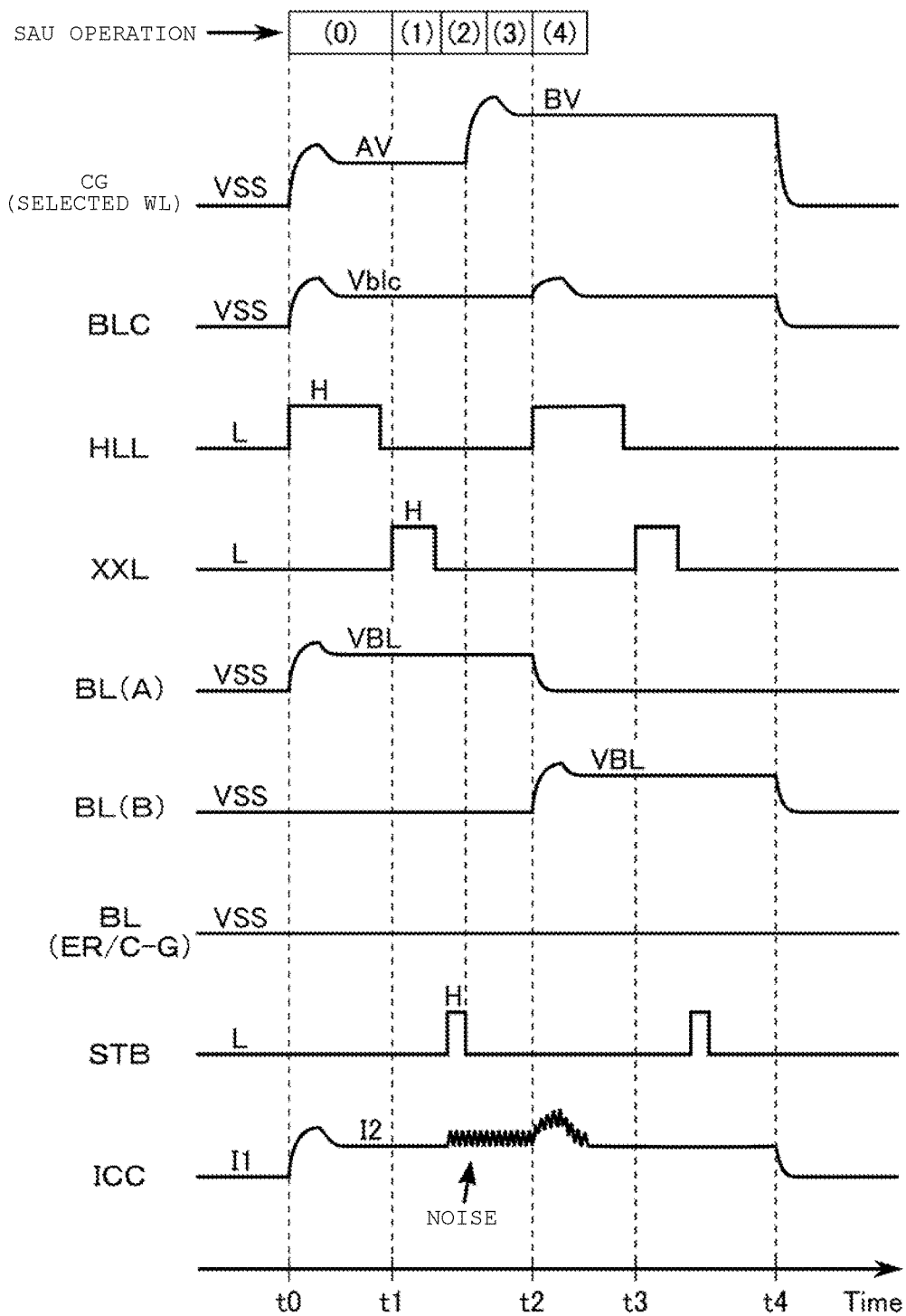
FIG. 18 is a timing chart illustrating an example of voltages and currents of respective interconnects in a verification operation of a semiconductor memory device according to the second embodiment.

FIG. 18 is an example of voltages and currents of respective interconnects in the verification operation of the semiconductor memory device 10 according to the second embodiment, and illustrates voltages of a signal line CG corresponding to the selected word line WL, control signals BLC, HLL, XXL, and STB, bit lines BL, and a current of a power supply current ICC.

FIGS. 19 to 23 are examples of operations of the latch circuits SDL, ADL, BDL, CDL, and DDL in the verification operation of the semiconductor memory device 10 according to the second embodiment, and illustrates status of the latch circuits SDL, ADL, BDL, CDL, and DDL and the node SEN in the sense amplifier unit SAU corresponding to the respective write levels. FIGS. 19 to 23 illustrate operations in the periods (0) to (4) illustrated in FIG. 18, respectively.

As illustrated in FIG. 18, at a time t0, the sequencer 17 sets the "A" write bit line BL to be charged as illustrated in FIG. 19, and sets other bit lines BL not to be charged ((0) in FIG. 18).

Specifically, the sequencer 17 sets the data stored in the latch circuit SDL in the "A" write sense amplifier unit SAU to "1", and sets the data stored in the latch circuits SDL in the other sense amplifier units SAU to "0".

In the write data received from the external memory controller, the lower-order bit data is stored in the latch circuit ADL, the middle-order bit data is stored in the latch circuit BDL, and the higher-order bit data is stored in the latch circuit CDL. However, the latch circuit, which stores the write data in the sense amplifier unit SAU, can be set to any arbitrary combination.

The voltage generation circuit 19 applies the verification voltage AV to the signal line CG corresponding to the selected word line WL. The verification voltage AV applied to the signal line CG is applied to the selected word line WL via the row decoder module 12. The sequencer 17 sets the voltage of the control signal BLC to a voltage Vblc. The transistor 22, to which the voltage Vblc is applied, is turned on, and each sense amplifier unit SAU applies a voltage to the corresponding bit line BL according to the write data stored in the internal latch circuit. In addition, the sequencer 17 sets the control signal HLL to the "H" level. When the control signal HLL becomes the "H" level, the transistor 25 is turned on, and the node SEN is charged. Then, when the node SEN is completely charged, the sequencer 17 sets the control signal HLL to the "L" level.

At the time t1, the sequencer 17 sets the control signal XXL to the "H" level. When the control signal XXL becomes the "H" level, a potential of the node SEN varies, as illustrated in FIG. 20, based on the sensed state of the memory cell transistor MT connected to the selected word line WL (Operation Period (1) in FIG. 18).

Next, the sequencer 17 sets the control signal XXL to the "L" level and then asserts the control signal STB. When the control signal STB is asserted, the "A" write sense amplifier unit SAU executes the "A" verification based on the status of the node SEN, and stores the sense result (which is verification result) in the internal latch circuit SDL as illustrated in FIG. 21 (Operation Period (2) in FIG. 18).

Next, the voltage generation circuit 19 applies the verification voltage BV to the signal line CG when the control signal STB is asserted and is returned to the "L" level. The verification voltage BV applied to the signal line CG is applied to the selected word line WL via the row decoder module 12. The timing at which the voltage generation circuit 19 applies the verification voltage BV to the signal line CG may be set, for example, from a time at which the control signal STB is asserted to the time t2.

Next, as illustrated in FIG. 22, the sequencer 17 sets the "B" write bit line BL to be charged (Operation Period (3) in FIG. 18). Specifically, the sequencer 17 updates data stored in the latch circuit SDL in the "B" write sense amplifier unit SAU to "1", and updates data stored in the latch circuit SDL in the other sense amplifier units SAU to "0". As a result, only the bit line BL corresponding to the "B" write sense amplifier unit SAU will be charged.

Then, at the time t2, the bit line BL corresponding to the sense amplifier unit SAU for which data of "1" is stored in the latch circuit SDL of the sense amplifier units SAU, is charged. Specifically, the bit line BL corresponding to the "B" write sense amplifier unit SAU is to be charged. At this time, in the second embodiment, the bit line BL corresponding to the "A" sense amplifier unit SAU is not to be charged.

However, in parallel with the charging of the bit line BL at the time t2, the sequencer 17 reflects the sense result of the "A" verification in the latch circuit in the "A" write sense amplifier unit SAU as illustrated in FIG. 23 (Operation Period (4) in FIG. 18). Specifically, as in the first embodiment, the sequencer 17 updates the data stored in the latch circuits ADL, BDL, and CDL in the corresponding sense amplifier unit SAU to the data similar to the "ER" level if the "A" verification is passed.

At the time t2, the sequencer 17 sets the control signal HLL to the "H" level. When the control signal HLL becomes the "H" level, the transistor 25 is turned on, and the node SEN is charged. Then, when the node SEN is completely charged, the sequencer 17 sets the control signal HLL to the "L" level.

As described above, the latch circuit in the sense amplifier unit SAU operates during each of the periods (2) to (4) illustrated in FIG. 18. At this time, similarly as described with reference to FIG. 7 in the first embodiment, the power supply current ICC fluctuates in amplitude and this may appear as noise. As a result, for example, the fluctuation of the power supply current ICC in the periods (2) to (4) illustrated in FIG. 18 is larger than the fluctuation of the power supply current ICC in the period (1) illustrated in FIG. 18, for example.

Other configurations of the verification operation in the second embodiment are the same as those of the verification operation in the first embodiment described with reference to FIG. 7, and thus the description thereof will not be presented.

[2-2] Effects of Second Embodiment

In the semiconductor memory device 10 according to the second embodiment, the sense amplifier SAU includes a larger number of latch circuits as compared to the first embodiment, and thus the sense result (verification result) and the information on the bit line BL to be charged can be stored in different latch circuits.

FIG. 24 is an example of a relation between the write level and the bit line charged in the verification operation in the second embodiment and the comparative example previously described and illustrates a case of consecutively executing "A" verification, "B" verification, "C" verification, "D" verification, "E" verification, "F" verification, and "G" verification in a single verification operation.

As illustrated in FIG. 24, the number of bit lines BL to be charged in the verification of each level in the second embodiment is equal to the number of bit lines BL to be charged in the verification of each level in the comparative example. Therefore, the semiconductor memory device 10 according to the second embodiment can perform the verification operation at a high speed like the first embodiment, and but with reduced current consumption as compared to the first embodiment.

[3] Modifications

Each of the semiconductor memory devices of the example embodiments includes the plurality of memory cells, word lines, bit lines, and a controller <see FIGS. 1 and 17>. The plurality of memory cells store data of a plurality of bits based on a threshold voltage is set to have a first threshold voltage <see FIG. 3, for example, "A" level> and a second threshold voltage <see FIG. 3, for example, "B" level> higher than the first threshold voltage. The word lines are connected to the plurality of memory cells. The plurality of bit lines are connected to the plurality of memory cells, respectively. The controller executes a program loop including a verification operation with a write operation. The controller, in the verification operation, sequentially applies the first verification voltage <see FIG. 7, for example, AV> and the second verification voltage <see FIG. 7, for example, BV> higher than the first verification voltage to the word line. The controller applies a first voltage <see FIG. 7, VBL> to a bit line connected to a memory cell to which the first data is to be written, while applying the first verification voltage to the word line, and applies a second voltage <see FIG. 7, VSS> lower than the first voltage to a bit line connected to a memory cell to which the second data is to be written. The controller applies the first voltage to a bit line connected to a memory cell for which verification by the first verification voltage is passed, of the memory cells to which the first data is to be written, and a bit line connected to a memory cell to which the second data is to be written, while applying the second verification voltage to the word line. With such a configuration, the semiconductor memory device 10 can perform the write operation at a high speed.

In the above embodiments, the operation timing of each component at each time may be varied. For example, the timing at which the voltage generation circuit 19 applies the voltage to the signal line CG may be different from the timing at which the sequencer 17 changes the control signal BLC.

Figure 25:
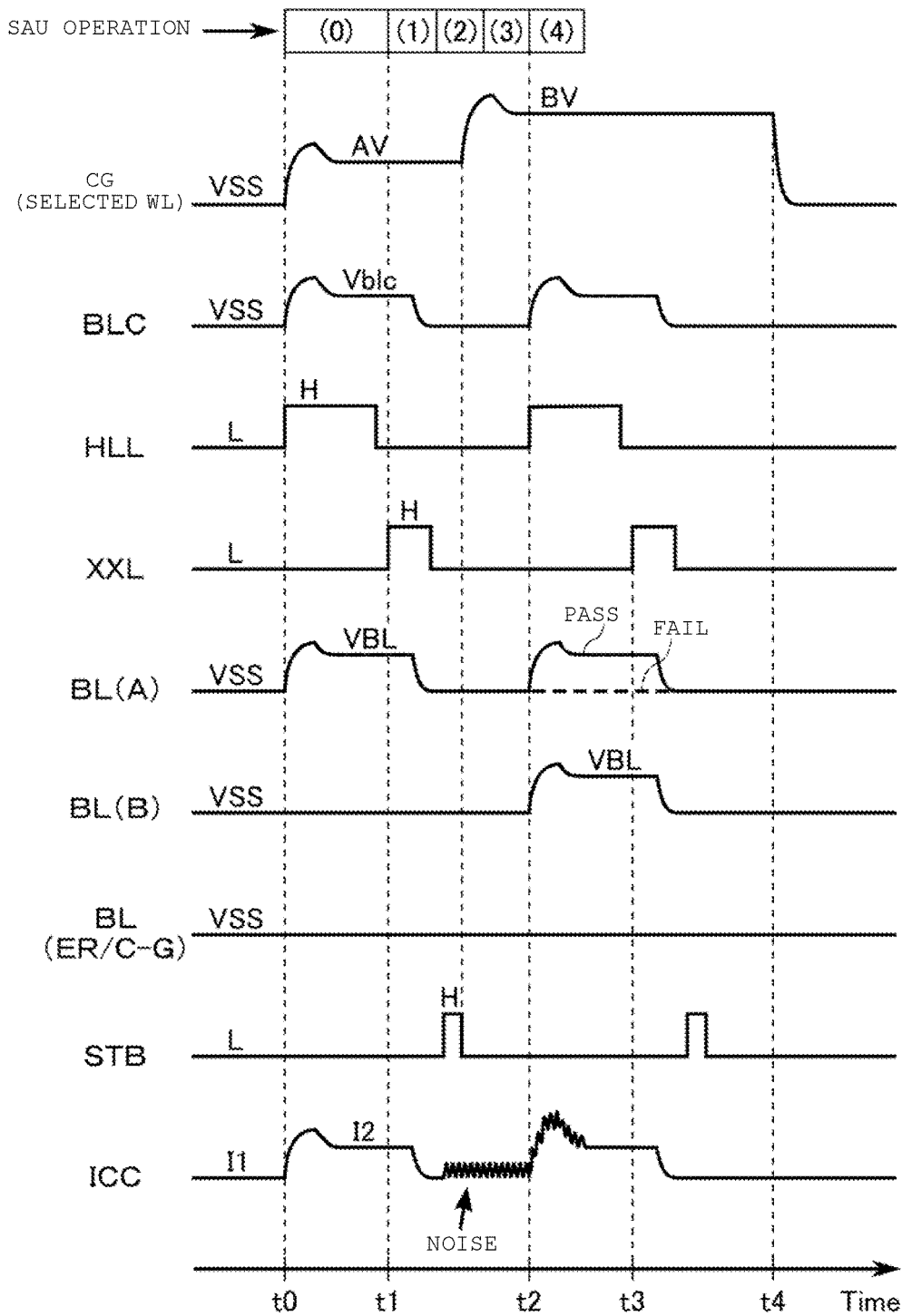
FIG. 25 is a timing chart illustrating an example of voltages and currents of respective interconnects in a verification operation of a semiconductor memory device according to a modification of the first embodiment.

In the verification operation described in the first embodiment, the control signal BLC may be controlled as illustrated in FIG. 25. FIG. 25 is an example of voltages and currents of respective interconnects in a verification operation of a semiconductor memory device 10 according to a modification of the first embodiment. In contrast to the verification operation described with reference to FIG. 7 in the first embodiment, control of the control signal BLC is different.

Specifically, as illustrated in FIG. 25, the sequencer 17 sets the control signal XXL to the "H" level at the time t1, and sets the voltage of the control signal BLC to VSS after the voltage of the node SEN goes into a sense-enabled state. Then, for example, the supply of the current to the bit line BL corresponding to the "A" write sense amplifier unit SAU is cut off, and the voltage of the "A" write bit line BL falls. Consequently, the value of the power supply current ICC also decreases.

When executing the verification of the next level at the time t2 after asserting the control signal STB, the sequencer 17 sets the voltage of the control signal BLC to the voltage Vblc in the same way as in the first embodiment. At the next level, the control signal BLC is also controlled in the same way as the operation at the time t1 described above.

Other operations of the verification operation in the modification are the same as those of the verification operation in the first embodiment, and thus the description thereof will not be presented. In the verification operation according to the modification of the first embodiment, thus, the current consumption can be reduced during the verification operation. It should be noted that the control of the control signal BLC in the verification operation according to the modification can also be applied to the verification operation of the second embodiment.

In the specification, the term "connected" means a state of electrically being connected, and includes a state of being connected by another element interposed therebetween, for example. In the specification, the term "turned off" means that a voltage less than the threshold voltage of the transistor is applied to the gate of the corresponding transistor, and for example, includes a state in which a minute current, such as a leak current of the transistor flows.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor memory device, comprising:
a plurality of memory cells that store first data values for multiple bits according to a first threshold voltage and second data values for the multiple bits according to a second threshold voltage higher than the first threshold voltage;
a plurality of word lines and plurality of bit lines connected to the plurality of memory cells, each memory cell being respectively connected to one word line and one bit line; and
a controller configured to write data to the plurality of memory cells in a write operation including a program loop with a verification operation following a program operation, wherein
the controller is configured to, during the verification operation:
apply a first verification voltage to a word line connected to a first memory cell, and then apply a second verification voltage higher than the first verification voltage to the word line,
apply a first voltage to a bit line connected to the first memory cell while the first verification voltage is being applied to the word line,
apply a second voltage lower than the first voltage to a bit line connected to a second memory cell that is connected to the word line while the first verification voltage is being applied to the word line, and
if the first memory cell passes verification at the first verification voltage, apply the first voltage to the bit line connected to the first memory cell and to the bit line connected to the second memory cell while the second verification voltage is being applied the word line.

2. The semiconductor memory device according to claim 1, wherein the controller is further configured to, during the verification operation:
apply the second voltage to the bit line connected to first memory cell while the second verification voltage is being applied to the word line if the first memory cell fails verification at the first verification voltage.

3. The semiconductor memory device according to claim 1, wherein
each memory cell further stores third data values for the multiple bits according to a third threshold voltage higher than the second threshold voltage, and
the controller is configured to, during the verification operation:
apply a third verification voltage higher than the second verification voltage to the word line after applying the second verification voltage to the word line, and
apply the first voltage to a bit line connected to a third memory cell while the third verification voltage is being applied to the word line.

4. The semiconductor memory device according to claim 3, the controller is configured to, during the verification operation:
if the second memory cell passes verification at the second verification voltage, apply the first voltage to the bit line connected to second memory cell and to the bit line connected to the third memory cell while the third verification voltage is being applied the word line, and
if the second memory cell fails verification at the second verification voltage, apply the second voltage to the bit line connected to second memory cell while the third verification voltage is being applied to the word line.

5. The semiconductor memory device according to claim 3, wherein the controller is configured to, in the verification operation:
apply the second voltage to a bit line connected to a third memory cell connected to the word line while applying the first verification voltage to the word line,
apply the second voltage to the bit line connected to the third memory cell while applying the second verification voltage to the word line, and
apply the second voltage to the bit line connected to the first memory cell while applying the third verification voltage to the word line.

6. The semiconductor memory device according to claim 5, the controller is configured to, during the verification operation:
if the second memory cell fails verification at the second verification voltage, apply the second voltage to the bit line connected to second memory cell while the third verification voltage is being applied to the word line.

7. The semiconductor memory device according to claim 1, further comprising:
a plurality of sense amplifier units connected to the plurality of bit lines, respectively, each sense amplifier unit including a first latch circuit for storing data to be written to the plurality of memory cells at the first threshold voltage.

8. The semiconductor memory device according to claim 1, further comprising:
a plurality of sense amplifier units connected to the plurality of bit lines, respectively, each sense amplifier unit including a plurality of latch circuits for storing data written to the plurality of memory cells according to a plurality of voltage thresholds.

9. A semiconductor memory device, comprising:
a plurality of memory cells that store first data values for multiple bits according to a first threshold voltage and second data values for the multiple bits according to a second threshold voltage higher than the first threshold voltage;

a plurality of word lines and a plurality of bit lines connected to the plurality of memory cells, each memory cell being respectively connected to one word line and one bit line;

a plurality of sense amplifier units respectively connected to the plurality of bit lines, each sense amplifier unit including include a first latch circuit and configured to apply a voltage to the respective bit line according to data stored in the first latch circuit; and a controller configured to write data to the plurality of memory cells in a write operation including a program loop with a verification operation followed by a program operation, wherein the controller is configured to, during the verification operation:

store data corresponding to a first logic level in a first latch circuit of a sense amplifier unit corresponding to a first memory cell connected to a word line, and store data corresponding to a second logic level in a first latch circuit of a sense amplifier unit corresponding to a second memory cell connected to the word line while applying a first verification voltage to the word line, and while applying a second verification voltage to the word line, store the data corresponding to the first logic level in the first latch circuit in the sense amplifier unit corresponding to the first memory cell, if the first memory cell passes verification at the first verification voltage, and store the data corresponding to the first logic level in the first latch circuit of the sense amplifier unit corresponding to the second memory cell.

10. The semiconductor memory device according to claim 9, wherein the controller is configured to, during the verification operation:

while applying the second verification voltage to the word line, store data corresponding to the second logic level in the first latch circuit of the sense amplifier unit corresponding to the first memory cell if the first memory cell has failed verification at the first verification voltage.

11. The semiconductor memory device according to claim 9, wherein each memory cell further stores third data values for the multiple bits according to a third threshold voltage higher than the second threshold voltage, and the controller is configured to, during the verification operation:

apply a third verification voltage higher than the second verification voltage after applying the second verification voltage to the word line, and while applying the third verification voltage to the word line, store data corresponding to the first logic level in the first latch circuit of the sense amplifier unit corresponding to the second memory cell, if the second memory cell passes verification at the second verification voltage, and store data in a first latch circuit of a sense amplifier unit corresponding to a third memory cell connected to the word line.

12. The semiconductor memory device according to claim 11, wherein the controller is configured to, during the verification operation:

while applying the first verification voltage to the word line, store the data corresponding to the second logic level in the first latch circuit of the sense amplifier unit corresponding to the third memory cell, while applying the second verification voltage to the word line, store the data corresponding to the second logic level in the first latch circuit of the sense amplifier unit corresponding to the third memory cell, and while applying the third verification voltage to the word line, store the data corresponding to the second logic level in the first latch circuit of the sense amplifier unit corresponding to the first memory cell, and, if the second memory cell failed verification at the second verification voltage, store data in the first latch circuit of the sense amplifier unit corresponding to the second memory cell.

13. The semiconductor memory device according to claim 9, wherein the plurality of memory cells store fourth data values for the multiple bits according to a fourth threshold voltage lower than the first threshold voltage, each of the plurality of sense amplifier units further includes a second latch circuit that stores write data corresponding to a first bit of the multiple bits and a third latch circuit that stores write data corresponding to a second bit of the multiple bits, and the controller is configured to, during the verification operation:

while applying the first verification voltage to the word line, store a verification result of the first memory cell, in the first latch circuit of the corresponding sense amplifier unit, and while applying the second verification voltage to the word line, store write data for the first and second bits of the fourth data values in the second and third latch circuits.

14. The semiconductor memory device according to claim 13, wherein each of the sense amplifier units receives a control signal generated by the controller, and the controller is configured to, during the verification operation:

set a voltage of the control signal to a first voltage when determining data stored in the corresponding memory cell based on the first verification voltage and the second verification voltage, between the determination of data based on the first verification voltage and the determination of data based on the second verification voltage, temporarily set the voltage of the control signal to be higher than the first voltage by a kick voltage amount, and mirror the verification result stored in the first latch circuit of the sense amplifier unit corresponding to the first memory cell in the second latch circuit and the third latch circuit, while the control signal is temporarily set higher by the kick voltage amount.

15. A semiconductor memory device, comprising:

a plurality of memory cells that store first data values for multiple bits according to a first threshold voltage and second data values for the multiple bits according to a second threshold voltage higher than the first threshold voltage;

a plurality of word lines and plurality of bit lines connected to the plurality of memory cells, each memory cell being respectively connected to one word line and one bit line; and a controller configured to write data to the plurality of memory cells in a write operation including a program loop with a verification operation following a program operation, wherein during the verification operation, the controller is configured to:

while a first verification voltage is being applied to a word line connected to a first memory cell, apply a first voltage to a bit line connected to the first memory cell, and apply a second voltage lower than the first voltage to a bit line connected to a second memory cell that is connected to the word line, and directly after applying the first verification voltage, apply a second verification voltage to the word line, the second verification voltage being higher than the first verification voltage, and while applying the second verification voltage to the word line:

apply the first voltage to the bit line connected to first memory cell and the bit line connected to the second memory cell if the first memory cell passes verification at the first verification voltage, and apply the second voltage to the bit line connected to the first memory cell and the first voltage to the bit line connected to the second memory cell if the first memory cell fails verification at the first verification voltage.

16. The semiconductor memory device according to claim 15, wherein each memory cell stores three bits of data according to a triple-level cell method.

17. The semiconductor memory device according to claim 15, wherein the plurality of memory cells are NAND-type flash memory cells.

18. The semiconductor memory device according to claim 15, further comprising:

a plurality of sense amplifier units corresponding to the plurality of bit lines.

19. The semiconductor memory device according to claim 18, wherein data from a data latch of at least one sense amplifier unit is transferred to another data latch while the first voltage is being applied to the bit line connected to the second memory cell during the verification operation.

* * * * *